(12) United States Patent
Hamamoto

(10) Patent No.: US 8,774,572 B2
(45) Date of Patent: Jul. 8, 2014

(54) BISTABLE ELEMENT

(75) Inventor: Kiichi Hamamoto, Fukuoka (JP)

(73) Assignee: Kyushu University, National University Corporation, Fukuoka (JP)

( * ) Notice: Subject to any disclaimer, the term of this patent is extended or adjusted under 35 U.S.C. 154(b) by 153 days.

(21) Appl. No.: 13/551,245

(22) Filed: Jul. 17, 2012

(65) Prior Publication Data

US 2013/0022310 A1  Jan. 24, 2013

Related U.S. Application Data

(63) Continuation of application No. PCT/JP2011/050881, filed on Jan. 19, 2011.

(30) Foreign Application Priority Data

Jan. 19, 2010 (JP) ................................. 2010-009249

(51) Int. Cl.
*G02B 6/42* (2006.01)

(52) U.S. Cl.
USPC .......................................................... 385/17

(58) Field of Classification Search
None
See application file for complete search history.

(56) References Cited

U.S. PATENT DOCUMENTS

| 6,697,548 B2 * | 2/2004 | LoCascio et al. | 385/16 |
| 2003/0123784 A1 * | 7/2003 | Mukai | 385/15 |

FOREIGN PATENT DOCUMENTS

| JP | 2003-084327 A | 3/2003 |
| JP | 2004-071875 A | 3/2004 |
| JP | 2008-250110 A | 10/2008 |

OTHER PUBLICATIONS

M. Takenaka, et al., "Multimode Interference Bistable Laser Diode", IEEE Photonics Technology Letters, Aug. 2003, vol. 15, No. 8, pp. 1035-1037.
H.A. Bastawrous, et al., "A Novel Active MMI Bi-Stable Laser Using Cross-Gain Saturation Between Fundamental and First Order Modes", Proceedings of the 34th European Conference on Optical Communication (ECOC 2008, Brussels, Belgium), Sep. 2008, vol. 5, pp. 81-82.
H.A. Bastawrous, et al., "Optical Memory Elements with Extremely Wide Hysteresis Window (94mA) Using Partly Saturable-Absorber Novel Active MMI Bi-Stable Laser Diodes", IEEE Optical Society of America, 2010.

(Continued)

*Primary Examiner* — Sung Pak
(74) *Attorney, Agent, or Firm* — Dingman, McInnes & McLane LLP

(57) ABSTRACT

A bistable element (100) comprising: a multi-mode interference optical waveguide (1), has two ports on one edge face (1a) thereof, and has one port on the other edge face (1b) thereof; a first group of optical waveguides (2), and each of which is composed of two optical waveguides each having one edge face connected to each port arranged on the one edge face (1a) side of the multi-mode interference optical waveguide (1); and a second group of optical waveguides (3), and each of which is composed of one optical waveguide having one edge face connected to each port arranged on the other edge face (1b) side of the multi-mode interference optical waveguide (1). The multi-mode interference optical waveguide (1) has a saturable absorption region (22) where the absorption coefficient is reduced to cause the saturation of the amount of absorbed light when the intensity of incident light becomes high.

8 Claims, 17 Drawing Sheets

(56) References Cited

OTHER PUBLICATIONS

H.A. Bastawrous, et al.,"Extremely Wide and Uniform Hysteresis Windows (32mA) for Integrated Optical RAM Using Novel Active MMI-BLD", IEEE, Optical Society of America, 2009.

M. Takenaka, et al., "All-Optical Flip-Flop Multimode Interference Bistable Laser Diode", IEEE Photonics Technology Letters, May 2005, vol. 17, No. 5, pp. 968-970.

K. Takeda, et al., "Experimental Study on Wavelength Tunability of All-Optical Flip-Flop Based on Multimode-Interference Bistable Laser Diode", IEEE Photonics Journal, Jun. 2009, vol. 1, No. 1.

* cited by examiner

BISTABLE ELEMENT

RELATED APPLICATIONS

This patent application is a continuation of International Application No. PCT/JP2011/050881, filed on Jan. 19, 2011, entitled, "BISTABLE ELEMENT," which claims priority to Japanese Patent Application No. 2010-009249, filed on Jan. 19, 2010, the contents and teachings of each of which are hereby incorporated by reference in their entirety.

FIELD

The present invention relates to a bistable element having an optical waveguide structure, and more particularly relates to such a bistable element in which a wide operating current range (i.e., a wide hysteresis window) can be obtained in a bistable operation.

BACKGROUND

Recently, as an element having an optical memory function which is necessary for realization of all-optical routers and so forth, a bistable element, above all, a semiconductor bistable element, is investigated.

Saying a word "semiconductor bistable element", semiconductor bistable elements based on a variety of principles are reported. In particular, as a representative example in which a relatively stabilized bistable operation is realized, a semiconductor bistable element, which utilizes a structure having two different optical waveguide paths in a multi-mode interference optical waveguide, is reported by Patent Document 1 (JP-2003-084327 A) and Non-Patent Document 1 (M. Takenaka and Others, "Multimode Interference Bistable Laser Diode", IEEE Photonics Technology Letters, Vol. 15, No. 8, pp. 1035-1037).

According to this semiconductor bistable element, although it is reported that a superior operation can be obtained as a bistable element, there are a problem (1) that a hysteresis window in a bistable operation (which is referred to as a bistable hysteresis window hereinafter) is narrow (a current must be set within a range less than several percentages of the bistable operation current), and a problem (2) that the element per se is not suitable to integration due to the fact that a full length of the element is too long.

Patent Document 2 (JP-2008-250110 A) and Non-Patent Document 2 (H. A. Bastawrous and Others, "A Novel Active MMI Bi-Stable Laser Using Cross-Gain Saturation Between Fundamental and First Order Modes", Proceedings of The 34th European Conference on Optical Communication (ECOC 2008, Brussels, Belgium), P. 2. 15, pp 81-82, September 2008) report a bistable element in which aforesaid problems have been solved.

In particular, in Non-Patent Document 2, it has been proved that a wide operating current condition, in which a bistable hysteresis window was about 10% of the operating current, and which could not be achieved by now, can be obtained.

SUMMARY

However, in the conventional bistable element, although the wide operating current condition, which could not be achieved by now, can be obtained, the bistable hysteresis window is merely on the order of 10% of the operating current at the most. Thus, when a future high-density integration is taken into consideration, there is still a problem that a further wide hysteresis window must be obtained. In particular, in the conventional bistable element, when a high-density integration is attempted, due to manufacturing errors, a bistable operation cannot be necessarily obtained at the same operating current value in all components of an integrated device, and thus it is difficult to carry out control at the same operating current. For this reason, in an integrated device including conventional bistable elements, it is necessary to set different operating currents in the respective elements (see: FIG. 17(a)), and thus there is a problem that it is difficult to put such an integrated device to practical use. On the other hand, when a further hysteresis window can be obtained, it is possible to set a common operating current in correspondence to deviation, which is derived from manufacturing errors, in operating currents for obtaining bistable operations in respective bistable elements (see: FIG. 17(b)).

The present invention has been developed to solve the aforesaid problems, and aims at providing a bistable element in which not only can miniaturization be further carried out in comparison with a conventional bistable element, but also it is possible to obtain a further wide bistable hysteresis window.

A bistable element according to the present invention comprises: a multi-mode interference optical waveguide provided on a substrate, and having a number M of ports formed in one end face thereof (M is integers more than one), and a number N of ports formed in another end face (N is integers more than zero, and less than M or equal to M); a first group of optical waveguides provided on the substrate, and including a number M of optical waveguides, each of which has one end face connected to a corresponding port formed in the one end face of the multi-mode interference optical waveguide; and a second group of optical waveguides provided on the substrate, and including a number N of optical waveguides, each of which has one end face connected to a corresponding port formed in the other end face of the multi-mode interference optical waveguide, wherein the multi-mode interference optical waveguide includes a saturable absorbing region in which saturation in an amount of absorbed light is caused by the fact that an absorbing coefficient is reduced as an intensity of incident light becomes larger.

In the bistable element according to the present invention, not only can miniaturization be further carried out in comparison with a conventional bistable element, but also it is possible to obtain a further wide bistable hysteresis window.

BRIEF DESCRIPTION OF THE DRAWINGS

The foregoing and other objects, features and advantages will be apparent from the following description of particular embodiments of the innovation, as illustrated in the accompanying drawings in which like reference characters refer to the same parts throughout the different views. The drawings are not necessarily to scale, emphasis instead being placed upon illustrating the principles of various embodiments of the innovation.

FIG. 5 is explanatory views for explaining a production method of the bistable element according to the first embodiment.

FIG. 6 is explanatory views for explaining the production method of the bistable element according to the first embodiment.

FIG. 7 is explanatory views for explaining the production method of the bistable element according to the first embodiment.

FIG. 8 is explanatory views for explaining the production method of the bistable element according to the first embodiment.

FIG. 9 is explanatory views for explaining another production method of a bistable element according to the first embodiment.

FIG. 10 is explanatory views for explaining the other production method of the bistable element according to the first embodiment.

FIG. 13 is explanatory views for explaining a production method of the bistable element according to the third embodiment.

FIG. 14 is explanatory views for explaining the production method of the bistable element according to the third embodiment.

FIG. 15 is explanatory views for explaining the production method of the bistable element according to the third embodiment.

FIG. 16 is explanatory views for explaining the production method of the bistable element according to the third embodiment.

FIG. 17 is explanatory views for explaining significance of a wide bistable hysteresis window.

DETAILED DESCRIPTION

First Embodiment

Figure 1:
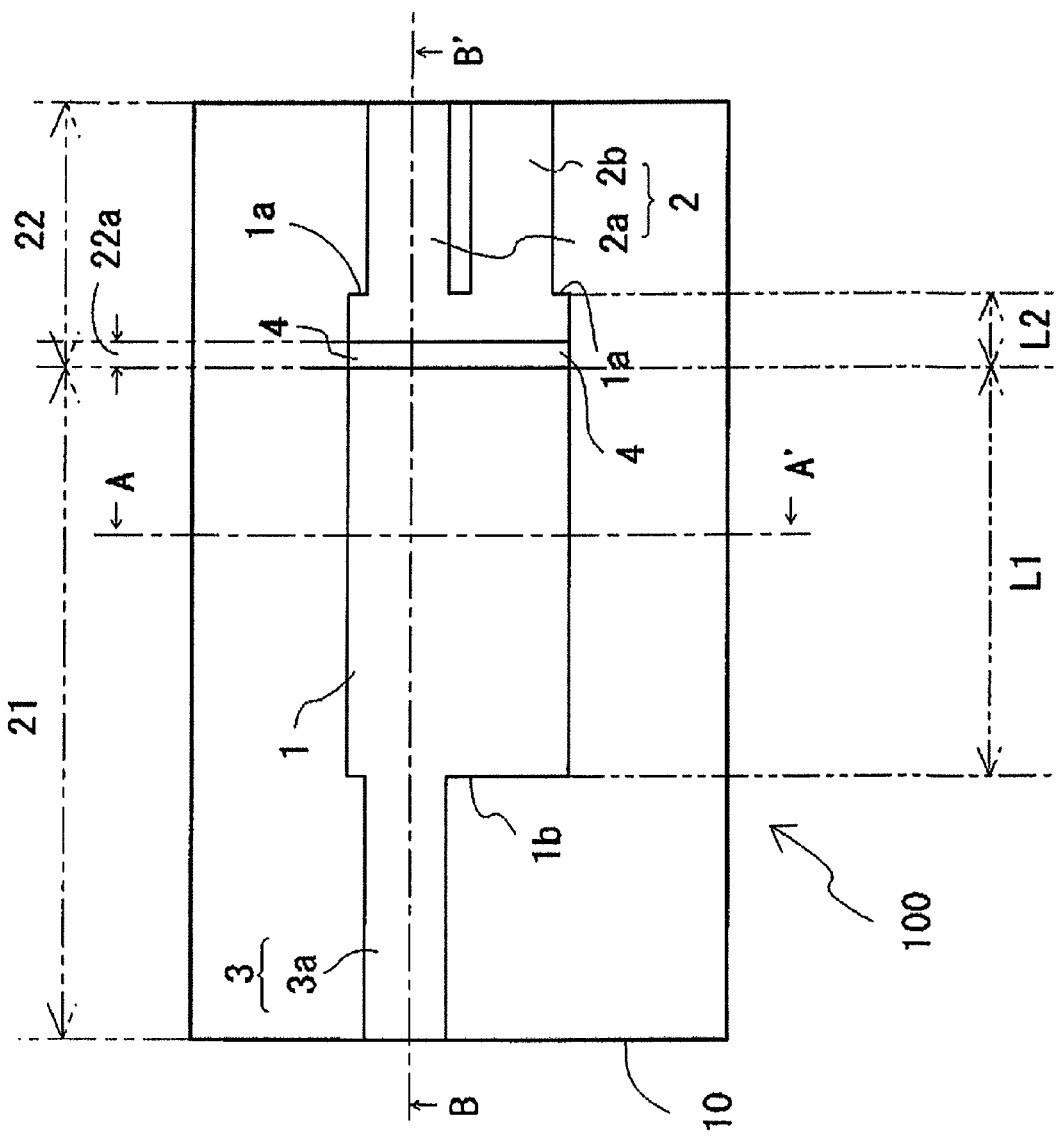
FIG. 1 is a plan view showing an example of a schematic structure of a bistable element according to a first embodiment.

As shown in FIG. 1, a bistable element 100 includes a multi-mode interference optical waveguide 1 as stated hereinafter, a first group of optical waveguides 2, and a second group of optical waveguides 3, which are integrated in a substrate 10.

The multi-mode interference optical waveguide 1 is provided on the substrate 10, and is defined as an active optical waveguide having a number M of ports formed in one end face 1a thereof (M is integers more than one), and a number N of ports formed in the other end face 1b (N is integers more than zero, and less than M or equal to M). Also, the multi-mode interference optical waveguide 1 includes a main exciting region 21 for exciting an active layer by supplying a bias current between an external electrode provided on a front surface of the substrate 10 (which is referred to as a front surface electrode hereinafter) and an external electrode provided on a rear surface of the substrate 10 (which is referred to as a rear surface electrode hereinafter), and a saturable absorbing region 22 in which saturation in an amount of absorbed light is caused by the fact that an absorbing coefficient is reduced as an intensity of incident light becomes larger. The saturable absorbing region 22 maintains a saturable absorbing state until a laser oscillation is started, but electrons and active holes are sufficiently created in the saturable absorbing region 22 after the laser oscillation is started, and thus loss is reduced in the saturable absorbing region 22, resulting in continuation of the laser oscillation.

Note, in this embodiment, although the multi-mode interference optical waveguide 1 having the two ports in the one end face 1a and the one port in the other end face 1b is explained, the present invention is not limited to only the multi-mode interference optical waveguide 1 having this number of ports. In particular, the multi-mode interference optical waveguide 1 according this embodiment is formed as a generally-rectangular interference region having a length of the waveguide (referred to as a waveguide length hereinafter) of about 135 □m, which is along a light guiding direction, and which is set in accordance with the below-mentioned formula (1), and a waveguide of about 7.4 μm.

Also, in this embodiment, a part of the saturable absorbing region 22, which is included in the multi-mode interference optical waveguide 1, is defined as a region in which a zero-order mode light and a first-order mode light defined as light propagating modes are not superimposed over each other. For example, the part of the saturable absorbing region 22, which is included in the multi-mode interference optical waveguide 1, is defined as a region having a region width which is equal to the waveguide width of the multi-mode interference optical waveguide 1, and a region length which is equal to a partial waveguide length of the multi-mode interference optical waveguide 1 measured from the one end face 1a to a predetermined location, with the part of the saturable absorbing region 22 being the region of the multi-mode interference optical waveguide 1 measured from the one end face 1a to the predetermined location. In particular, in this embodiment, the part of the saturable absorbing region 22, which is included in the multi-mode interference optical waveguide 1, has the region length of about 29 □m (25 □m except for the below-mentioned electrical separating groove 4), which is measured from the one end face 1a of the multi-mode interference optical waveguide 1 to the predetermined location. Note that the region length of the part of the saturable absorbing region 22, which is included in the multi-mode interference optical waveguide 1, i.e., the distance, which is measured from the one end face 1a of the multi-mode interference optical waveguide 1 to the predetermined location, may be set based on characteristics of the bistable element 100 and the waveguide length (and the waveguide width) of the multi-mode interference optical waveguide 1. For example, it may be set so as to be equal to or less than a half of the waveguide width length of the multi-mode interference optical waveguide 1, whereby it is possible to secure the main exciting region 21 so as to contribute to the laser oscillation. Also, for example, in a case where the region length of the part of the saturable absorbing region 22, which is included in the multi-mode interference optical waveguide 1, i.e., the distance, which is measured from the one end face 1a of the multi-mode interference optical waveguide 1 to the predetermined location, is set so as to be equal to or more than the waveguide width of the multi-mode interference optical waveguide 1, it is possible to obtain a desirable wide bistable hysteresis window, as mentioned hereinafter.

In particular, as stated above, in the bistable element 100 according to this embodiment, the waveguide length L1 of the multi-mode interference optical waveguide 1 is about 135 μm, and the waveguide width L2 of the multi-mode interference optical waveguide 1 is about 7.4 μm. Also, the region length L2 of the part of the saturable absorbing region 22, which is included in the multi-mode interference optical waveguide 1, is about 29 μm. Thus, a percentage of the region length L2 of the part of the saturable absorbing region 22 to the waveguide length L1 of the multi-mode interference optical waveguide 1 is 21.5% (=29/135μ 100), and this result fulfills the conditions as mentioned above by way of example, whereby not only can a desirable wide bistable hysteresis as mentioned hereinafter be obtained, but also it is possible to secure the main exciting region 21.

The electrical separating groove 4 is formed by removing a part of the below-mentioned contact layer 16 so as to cross the lengthwise direction of the multi-mode interference optical waveguide 1. Note that the electrical separating groove 16 according to this embodiment is provided in the multi-mode interference optical waveguide 1 so as to extend from the boundary between the main exciting region 21 and the saturable absorbing region 22 toward the side of the saturable absorbing region 22 by a distance of about 4 μm. The first group of optical waveguides 2 includes the number M of optical waveguides, each of which has one end face connected to a corresponding one of the formed in the one end face 1a of the multi-mode interference optical waveguide 1, and each of the optical waveguides included in the first group 2 is defined as an active optical waveguide included in the saturable absorbing region 22. Also, the other end face of each of the optical waveguides included in the first group 2 is defined as a light-incidence face and/or a light-emission face.

Note, in this embodiment, since reference is made by way of example to the multi-mode interference optical waveguide 1 having the two ports formed in the one end face 1a thereof, two optical waveguides (a first optical waveguide 2a and a second optical wave guide 2b) are included in the first group of optical waveguides 2. Also, the first and second optical waveguides 2a and 2b are perpendicularly connected to the one end face 1a of the multi-mode interference optical waveguide 1 so as to be juxtaposed with each other.

In particular, each of the first and second optical waveguides 2a and 2b according to this embodiment is defined as a generally-rectangular linear waveguide having a waveguide length of about 65 μm, and a waveguide width of about 2.7 μm. Also, the optical waveguides (the first and second optical waveguides 2a and 2b) included in the first group 2 forms the other or remaining part of the saturable absorbing region 22, with each of the optical waveguides, which form the other part of the saturable absorbing region 22, having a region width and a region length which are respectively equal to the waveguide width and the waveguide length of the optical waveguide concerned. In short, each of the first and second optical waveguides 2a and 2b has no part included in the main exciting region 21, and forms only the other part of the saturable absorbing region 22.

The second group of optical waveguides 3 includes the number N of optical waveguides, each of which has one end face connected to a corresponding one of the formed in the other end face 1b of the multi-mode interference optical waveguide 1, and each of the optical waveguides included in the second group 2 is defined as an active optical waveguide. Also, the other end face of each of the optical waveguides included in the second group 3 is defined as a light-incidence face and/or a light-emission face.

Note, in this embodiment, since reference is made by way of example to the multi-mode interference optical waveguide 1 having the one port formed in the other end face 1b thereof, one optical waveguide (a third optical waveguide 3a) is included in the second group 3. Also, the third optical waveguide 3a is positioned so as to be opposite to the first waveguide 2a included in the first group 2, with the multi-mode interference optical waveguide 1 being intervened therebetween. In short, the third optical waveguide 3a is defined as an optical waveguide in which a zero-order mode light and a first-order mode light, each of which is defined as a light propagating mode, are allowed.

In particular, the third optical waveguide 3a according to this embodiment is defined as a generally-rectangular linear waveguide having a waveguide length of about 90 μm, and a waveguide width of about 2.7 μm. Also, the third optical waveguide 3a has no part included in the saturable absorbing region 22, and forms only the part of the main exciting region 21.

Accordingly, in the stable element 100 according to this embodiment, the saturable absorbing region 22 is defined by a part of the multi-mode interference optical waveguide 1 and the first group of optical waveguides 2, which continuously extend as the saturable absorbing region 22, with a full length of the saturable absorbing region 22 being about 94 μm (90 μm except for the electrical separating groove 4). Also, in the stable element 100 according to this embodiment, the main exciting region 21 is defined by the other part of the multi-mode interference optical waveguide 1 and the second group of optical waveguides 3.

Note, the other part of the multi-mode interference optical waveguide 1 and the second group of optical waveguides 3 (i.e., the third optical waveguide 3a), which form the main exciting region 21, have the same layer structure. Also, the part of the multi-mode interference optical waveguide 1 and the first group of optical waveguides 2 (i.e., the first and second optical waveguides 2a and 2b), which form the saturable absorbing region 22, have the same layer structure. In particular, in this embodiment, the multi-mode interference optical waveguide 1, the first group of optical waveguides 2 (i.e., the first and second optical waveguides 2a and 2b) and the second group of optical waveguides 3 (i.e., the third optical waveguide 3a) have the same layer structure except for the electrical separating groove 4 in the multi-mode interference optical waveguide 1.

Figure 2A:
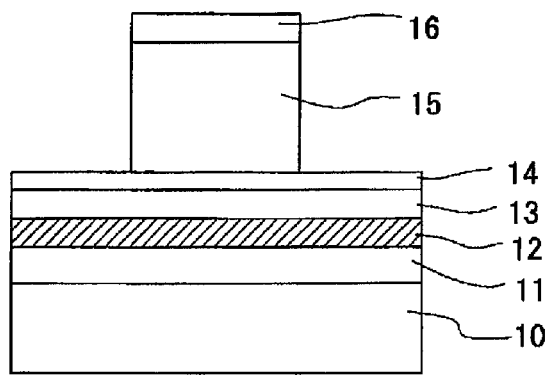
FIG. 2(a) is a cross-sectional view taken along the A-A' line in the bistable element shown in FIG. 1.
Figure 2B:
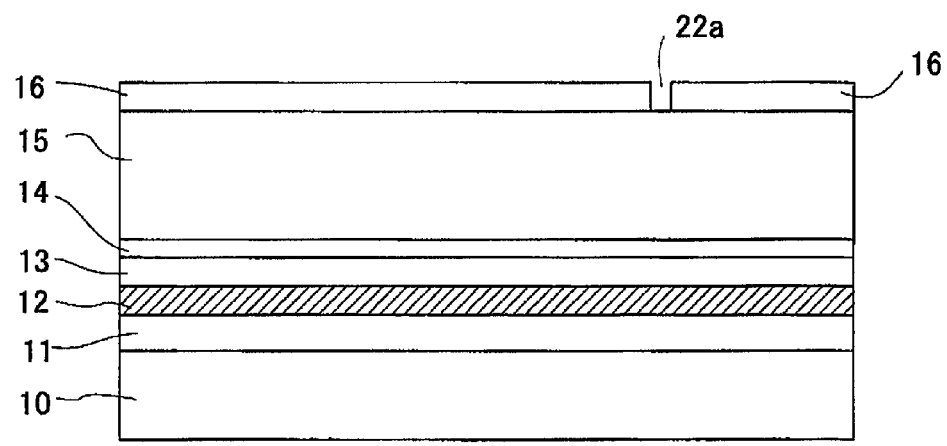
FIG. 2(b) is a cross-sectional view taken along the B-B' line in the bistable element shown in FIG. 1.

As shown in FIG. 2(a), concretely, a cross-sectional structure of the main exciting region 21 is defined as a ridge structure in which a buffer layer 11 composed of an n-InP-based material forming an n-type semiconductor, a light-emitting layer 12 composed of an InGaAsP/InGaAsP-based material and defined as an active layer for realizing a bistable element featuring a long wavelength region (a 1.55 □m region), a first clad layer 13 composed of an p-InP-based material forming a p-type semiconductor, an etching stopper layer 14 composed of a p-InGaAsP-based material forming a p-type semiconductor, a second clad layer 15 composed of a p-InP-based material forming a p-type semiconductor, a contact layer 16 composed of a p-InGaAs-based material forming a p-type semiconductor are laminated in order on a substrate 10 composed of an n-InP-based material. Also, as shown in FIG. 2(b), in comparison with the cross-sectional structure of the main exciting region 21, a cross-sectional structure of the saturable absorbing region 22 corresponds to one in which the contact layer 16 is partially removed from a region forming the electrical separating groove 4 (which is referred to as a separating groove region 22a hereinafter).

As shown in FIG. 2(a), the aforesaid ridge structure corresponds to one in which the contact layer 16 and the second clad layer 15 are partially removed from a non-waveguide region by an etching process.

In particular, in this embodiment, the buffer layer 11 is about 100 nm in film thickness; the light-emitting layer 12 is 100 nm in film thickness; the first clad layer 13 is 200 nm in film thickness; the etching stopper layer 14 is 10 nm in film thickness; the second clad layer 15 is 800 nm in film thickness; and the contact layer 16 is 150 nm in film thickness.

Note, in the bistable element 100 according to this embodiment, although the multi-mode interference optical waveguide 1, the first group of optical waveguides 2 and the second group of optical waveguide 3 have the ridge structure, the present invention is not necessarily limited to this ridge structure, and may be applied to, for example, a buried structure, a high-mesa structure and so forth.

Also, although the light-emitting layer 12 according to this embodiment is defined as a usual light-emitting layer featuring an SCH (separate confinement hetero-structure) and an MQW (multi-quantum well), the present invention is not necessarily limited to only this usual light-emitting layer. For example, the light-emitting layer may feature a strained layer multiple quantum well or may be defined as a bulk light-emitting layer.

Also, although the light-emitting layer 12 according to this embodiment features the 1.55 μm wavelength region, the present invention is not necessarily limited to only this wavelength region. For example, the light-emitting layer may feature a 1.3 μm wavelength region, or a visual light region.

Further, although the InGaAsP/InGaAsP-based material is used for the light-emitting layer 12 according to this embodiment, the present invention is not necessarily limited to only this material. For example, an InGaAlAs-based material may be used for it, or it is possible to freely select a material so as to accord with the wavelength region.

Next, a principle for obtaining a wide bistable hysteresis window in the bistable element 100 according to this embodiment will explained below.

Before the principle of the present invention is explained, an operating principle of a conventional bistable element 200 in an all-optical flip-flop, which is disclosed in Patent Document 1 as a multi-mode interference optical waveguide type bistable element having two ports in each of opposite end faces thereof, is explained with reference to FIG. 3(a).

Figure 3A:
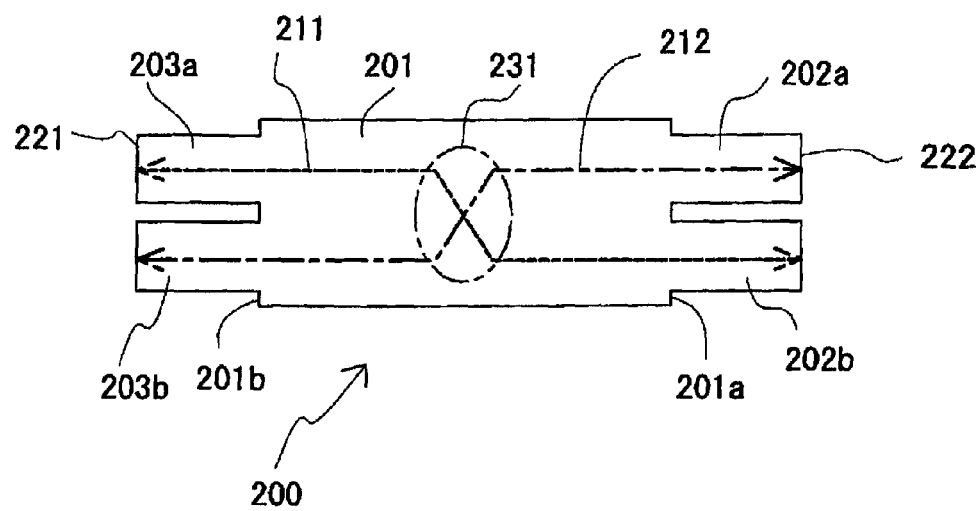
FIG. 3(a) is an explanatory view for explaining an operation of a bistable element.

Note, as shown in FIG. 3(a), the conventional bistable element 200 includes a multi-mode interference optical waveguide 201 having a generally rectangular shape in a plan view, a first optical waveguide 202a, a second optical waveguide 202b, a third optical waveguide 203a and a fourth optical waveguide 203b which are joined to the multi-mode interference optical waveguide 201. Also, the first and second optical waveguides 202a and 202b are joined to one end face 201a of the multi-mode interference optical waveguide 201, and the third and fourth optical waveguides 203a and 203b are joined to the other end face 201b of the multi-mode interference optical waveguide 201, which is opposite to the one end face 201a thereof. Also, the first optical waveguide 202a and the third optical waveguide 203a are substantially aligned with each other, and the second optical waveguide 202b and the fourth optical waveguide 203b are substantially aligned with each other.

As shown in FIG. 3(a), in general, the operating principle of the bistable element 200 is based on the fact that (1) there are two optical waveguide paths (i.e., optical waveguide paths 211 and 212 in FIG. 3(a)), in which laser-lights can be simultaneously oscillated, in the multi-mode interference optical waveguide 201, and that (2) the oscillation is selected in only one of the two optical waveguide paths in accordance with a cross-gain difference between the two optical waveguide paths in the multi-mode interference optical waveguide 201.

For example, on the condition that a certain constant operating current is previously injected into the active optical waveguide (i.e., the multi-mode interference optical waveguide 201, the first optical waveguide 202a, the second optical waveguide 202b, the third optical waveguide 203a and the fourth optical waveguide 203b), when a laser light is input from an outside to a port 221, one of the optical waveguide paths 211 and 212, i.e., the optical waveguide path 211 having the port 221 as an input terminal is selected as an optical waveguide path for laser light oscillation. In this time, a gain on the one optical waveguide path 211 in the multi-mode interference optical waveguide 201 becomes larger in comparison with a gain on the other optical waveguide path 212, resulting in the laser light oscillation being obtained in only the one optical waveguide path 211.

Next, in this condition, when a laser light is input to a port 222, the other optical waveguide path 212 having the port 222 as an input terminal is selected as a waveguide path for laser light oscillation. In this time, the gain on the other optical waveguide path 212 in the multi-mode interference optical waveguide 201 becomes larger in comparison with the gain on the one optical waveguide path 211, resulting in the laser light oscillation being obtained in only the other optical waveguide path 212, and thus the laser light oscillation in the one optical waveguide path 211 is stopped by way of compensation. Like this, in the conventional bistable element 200, the two bistable states are created.

Nevertheless, a region 231, in which the two optical waveguide paths, i.e., the optical waveguide paths 211 and 212 are intersected with each other, merely occupies the multi-mode interference optical waveguide 201 at a very small ratio. Since the conventional bistable element 200 merely utilizes the cross-gain difference in the very small region, there is a problem that it is not possible to obtain a wide bistable hysteresis window.

Then, an operating principle of a conventional bistable element 300, which is disclosed in Patent Document 2 as a multi-mode interference optical waveguide type bistable element having two ports in one end face thereof and one port in the other end face thereof, is explained with reference to FIG. 3(b).

Figure 3B:
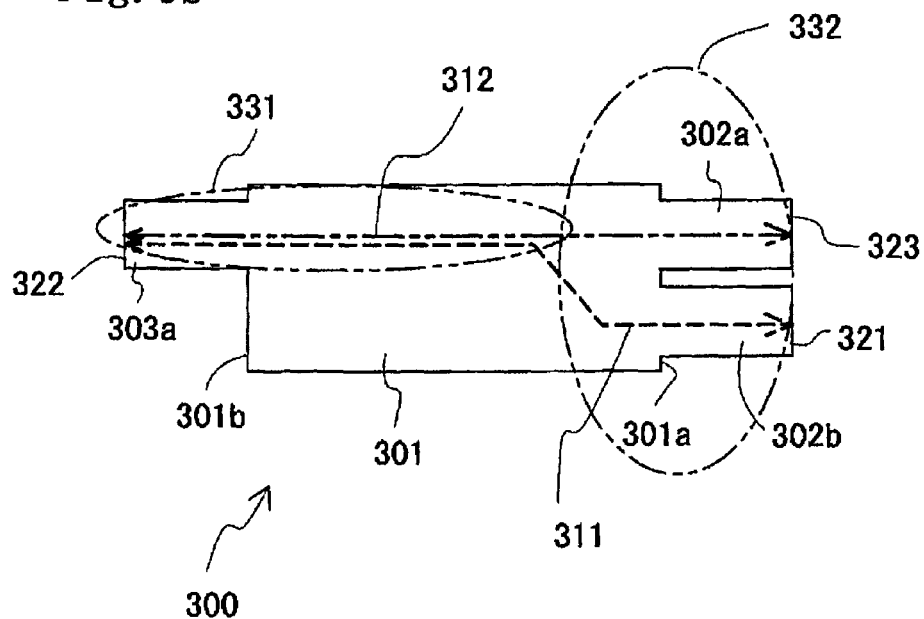
FIG. 3(b) is an explanatory view for explaining an operation of another bistable element.

Note, as shown in FIG. 3(b), the conventional bistable element 300 includes a multi-mode interference optical waveguide 301 having a generally rectangular shape in a plan view, a first optical waveguide 302a, a second optical waveguide 302b and a third optical waveguide 303a which are joined to the multi-mode interference optical waveguide 301. Also, the first and second optical waveguides 302a and 302b are joined to one end face 301a of the multi-mode interference optical waveguide 301, and the third and fourth optical waveguide 303a is joined to the other end face 301b of the multi-mode interference optical waveguide 301, which is opposite to the one end face 301a thereof. Also, the first optical waveguide 302a and the third optical waveguide 303a are substantially aligned with each other, and the second optical waveguide 302b are parallel to the first and third optical waveguides.

This conventional bistable element 300 features the following two stable modes as a light propagating mode:

(i) Zero-Order Mode Light:

When a laser light is input from an outside to a port 321, a zero-order mode light enters the multi-mode interference optical waveguide 301 from the second optical waveguide 302b, travels along a cross path in the multi-mode interference optical waveguide 301, and then radiates from a port 332 of the third optical waveguide 303a (as indicated by a waveguide path 311 shown in FIG. 3(b)).

(ii) First-Order Mode Light:

When a laser light is input from an outside to a port 323, a first-order mode light enters the multi-mode interference optical waveguide 301 from the first optical waveguide 302a, travels along a generally linear path in the multi-mode interference optical waveguide 301, and then radiates from the port 332 of the third optical waveguide 303a (, as indicated by a waveguide path 312 shown in FIG. 3(b)).

Like this, the third optical waveguide 303a is constituted so that the zero-order mode light and the first-order mode light can exist as standing waves. Also, the multi-mode interference optical waveguide 301 features a region (i.e., a cross-gain restraint region 331) in which the zero-order mode light and the first-order mode light are integrated with and superimposed over each other.

As is apparent from the foregoing, an operation principle of the bistable element 100 according to this embodiment is based on the fact that (1) a generally crank-shaped optical waveguide path (which corresponds to the optical waveguide path 311 shown in FIG. 3(b)) and a generally linear optical waveguide path (which corresponds to the optical waveguide path 312 shown in FIG. 3(b)) are utilized as two optical waveguide paths in which laser-lights can be simultaneously oscillated, and that (2) the oscillation is selected in only one of the two optical waveguide paths in accordance with a cross-gain difference between the two optical waveguide paths.

In particular, according to the present invention, it is possible to utilize the superimposition of the two optical waveguide paths 311 and 312 in the wide region (i.e., the cross-gain restraint region 331). In short, in the multi-mode interference optical waveguide 1, a phenomenon, in which respective self interference images occur in a cross direction on a zero-order mode and a bar direction on a first-order mode, respectively, is utilized when a waveguide length LMMI of the multi-mode interference optical waveguide 1 is represented by the following formula:

NF (Numerical Formula) 1

$$L_{MMI} = 3L_\pi/4 \approx n_r W_e^2/\lambda \quad (1)$$

Herein: $L_\pi$, is a beat length; $W_e$ is an effective width of the optical waveguide; $n_r$ is a refraction of the waveguide region, and $\lambda$ is a wavelength.

Nevertheless, even in the structure shown in FIG. 3(b), there is a region which does not belong to the cross-gain restraint region 331, i.e., a region (i.e., a non-cross-gain restraint region 332) in which the two optical waveguide paths (the optical waveguide paths 311 and 312) are not superimposed with each other, and this means that a further wide bistable hysteresis window can be obtained by improving such a region.

Thus, the following facts (1) and (2) have been found by the recent researches of the inventors:

(1) The two optical waveguide paths in the saturable absorbing region do not serve as the cross-gain restraint region. That is, the bistable hysteresis window can be controlled by the superimposition of the two optical waveguide paths.

(2) Although a part of the multi-mode interference optical waveguide forming the active optical waveguide is defined as the saturable absorbing region, it is possible to obtain an active multi-mode interference effect.

The aforesaid fact (1) means that it is possible to obtain a further large cross-gain restraint effect by extending the region (i.e., the non-cross-gain restraint region), in which the superimposition of the two optical waveguide paths is not obtained, as the saturable absorbing region as large as possible, so that a ratio, at which the main exciting region is occupied by the superimposition region of the two optical waveguide paths (i.e., the cross-gain restraint region), is increased. That is, before the wide bistable hysteresis window can be obtained, the region (i.e., the non-cross-gain restraint region), in which the two optical waveguide paths are not theoretically superimposed over each other, must be extended as the saturable absorbing region as large as possible.

Further, according to the aforesaid fact (2), it has been found that it is possible to obtain the active multi-mode interference effect in the active optical waveguide in which the part of the multi-mode interference optical waveguide is defined as the saturable absorbing region, which has not been proved by now. Thus, it is possible to theoretically obtain the substantially complete superimposition region (i.e., the cross-gain restraint region) between the two optical waveguide paths in the main exciting region, by defining the region (i.e., the non-cross-gain restraint region), in which the superimposition of the two optical waveguide paths is not almost obtained, as the saturable absorbing region in the multi-mode interference optical waveguide.

Figure 4A:
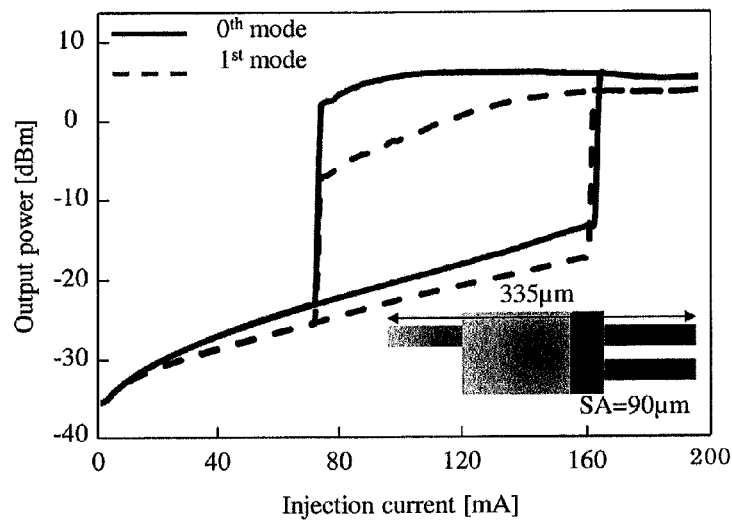
FIG. 4(a) is an explanatory view for explaining a bistable hysteresis window in the bistable element shown in FIG. 1.
Figure 4B:
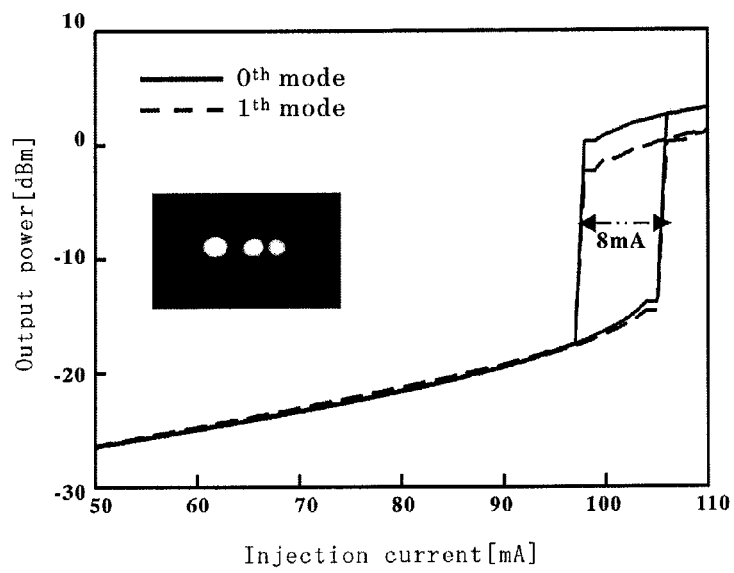
FIG. 4(b) is an explanatory view for explaining a bistable hysteresis window in a conventional bistable element.

In the bistable element 100 according to this embodiment designed based on the above-mentioned principle, as shown in FIG. 4(a), it was possible to obtain the bistable hysteresis featuring 93 mA, which corresponds to more than ten times larger than 8 mA of the bistable hysteresis window (see: FIG. 4(b)), which is reported by Non-Patent Document 2.

Note, in this embodiment, although the waveguide length of the multi-mode interference optical waveguide 1 is set based on the above-mentioned formula (1), it is unnecessary to precisely carry out the setting of the waveguide length. If the waveguide length of the multi-mode interference optical waveguide 1 is set within the □10% range of a value obtained from the formula (1), this setting is applicable to the present invention.

Also, in this embodiment, although the port 321 is selected as the input port for the zero-order mode light, and although the port 323 is selected as the input port for the first-order mode light, the present invention is not limited to only this combination of the input ports. For example, if a port 322 may be selected as the input port for the zero-order mode light, and if the 323 may be selected as the input port for the first-order mode light, this combination of the input ports is applicable to the present invention. Also, if the port 321 is selected as the input port for the zero-order mode light, and if the port 322 is selected as the input port for the first-order mode light, this combination of the input ports is applicable to the present invention. Further, it is possible to select the port 322 as the input port for both the zero-order mode light and the first-order mode light. In this case, the port 321 may be selected as the output port for the zero-order mode light, and the port 323 may be selected as the output port for the first-order mode light.

Next, with reference to FIG. 2, FIGS. 5 to 8, a production method of the bistable element 100 according to this embodiment will now be explained.

Figure 5A:
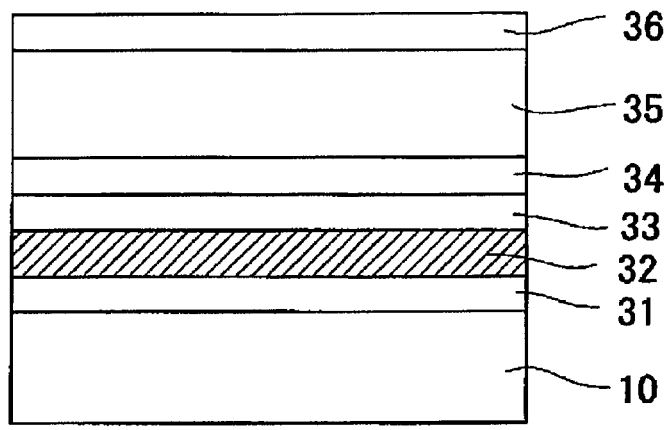
FIG. 5(a) is a cross-sectional view corresponding to the cross-sectional view taken along the A-A' line in the bistable element shown in FIG. 1, in which a epitaxial structure is produced by an MOCVD process.

First, an n-In film 31 (the buffer layer 11), a 1.55 μm wavelength region InGaAsP/InGaAsP film 32 (the light emitting layer 12), a first p-InP film 33 (the first clad layer 13), a p-InGaAs film 34 (the etching stopper layer 14), a second p-InP film 35, and a p-InGaAs film 36 are grown in order on a usual n-InP substrate 10 by using an MOCVD (metal organic chemical vapor deposition) process (FIG. 5(a)).

Figure 5B:
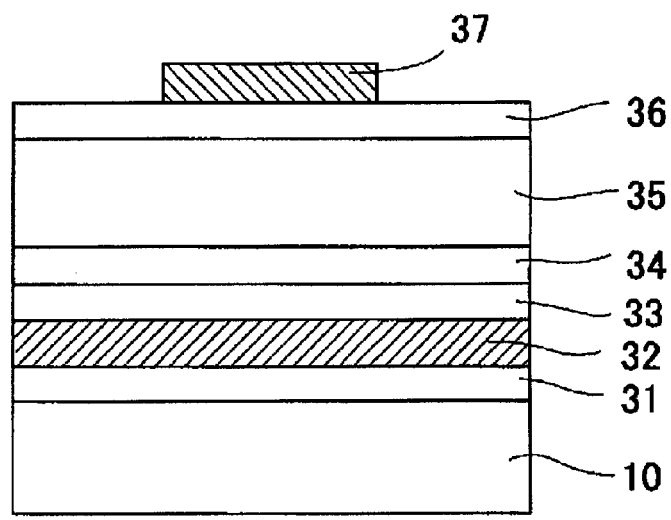
FIG. 5(b) is a cross-sectional view corresponding to the cross-sectional view of FIG. 5(a) in which a mask is formed.

Then, a mask 37 for an etching process is formed on the p-InGaAs film 36 by a photolithography process using a stepper (i.e., a lens reduction projection aligner) so as to conform with a plane configuration of the multi-mode interference optical waveguide 1, the first group of optical waveguides 2 and the second group of optical waveguides 3 shown in FIG. 1 (FIG. 5(b)).

Figure 5C:
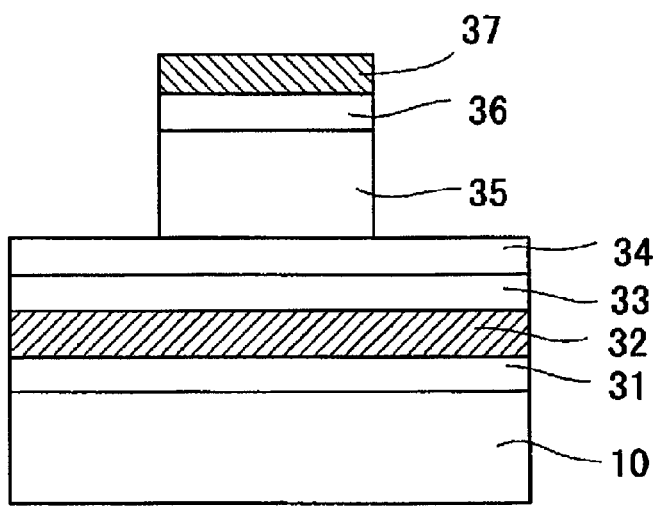
FIG. 5(c) is a cross-sectional view corresponding to the cross-sectional view of FIG. 5(b) in which a ridge structure formed.

With using the mask 37, the p-InGaAs film 36 to be defined as the contact layer 16, and the second p-InP film 35 to be defined as the second clad layer 15 are subjected to a dry etching process using an ICP (inductively coupled plasma) process, so that the disused portions of the p-InGaAs film 36 and the second p-InP film 35 (on which the mask 37 is not formed) are removed, resulting in the formation of the ridge structure in the cross-sectional configuration (FIG. 5(c)).

Thereafter, the mask 37, which lies on the contact layer 16, is removed by using an chemical solution and an ashing process (FIG. 2(a)).

Note, production steps stated hereinafter are directed to a separation of the ridge structure, including the multi-mode interference optical waveguide 1, the first group of optical waveguides 2 and the second group of optical waveguides 3, into the main exciting region 21 and the saturable absorbing region 22.

Figure 6A:
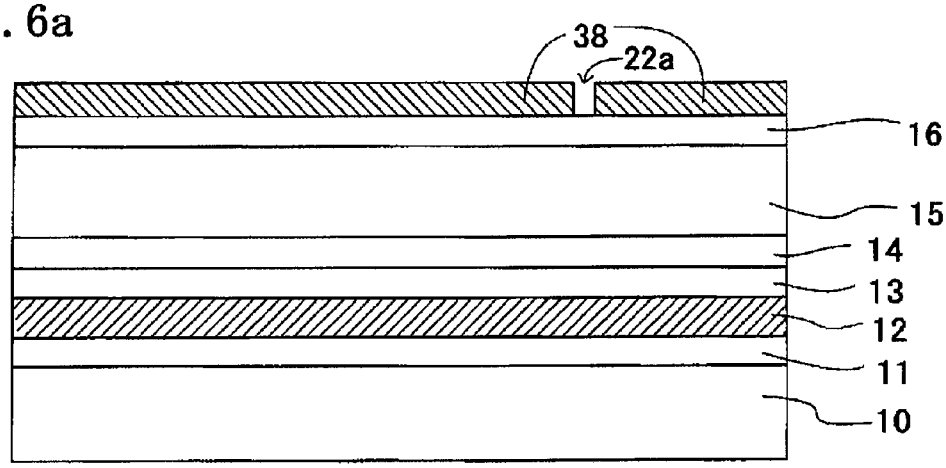
FIG. 6(a) is a cross-sectional view corresponding to the cross-sectional view taken along the B-B' line in the bistable element shown in FIG. 1, in which a mask for an electrical separating groove is formed.

Then, a mask 38 for an etching process is formed on the contact layer 16 and the etching stopper layer 14 by the photolithography process using the stepper so as to conform with the plane configuration, except for the electrical separating groove 4, shown in FIG. 1 (FIG. 6(a)).

Figure 6B:
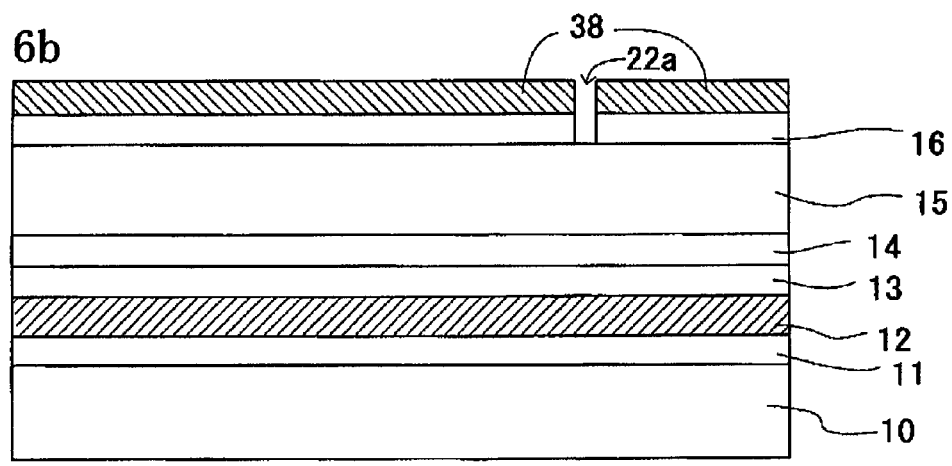
FIG. 6(b) is a cross-sectional view corresponding to the cross-sectional view of FIG. 6(a) in which a mask is formed.

With using the mask 38, the contact layer 16 is subjected to a wet etching process using a sulfuric-acid-based etching solution so that the contact layer 16 is removed from a part (corresponding to the separating groove region 22a) of the multi-mode interference optical waveguide 1, at which the electrical separating groove 4 is to be defined (FIG. 6(b)).

Thereafter, the mask 38, which lies on the contact layer 16 and the etching stopper layer 14 except for the separating groove region 22a, is removed by using the chemical solution and the ashing process (FIG. 2(b)).

Figure 6C:
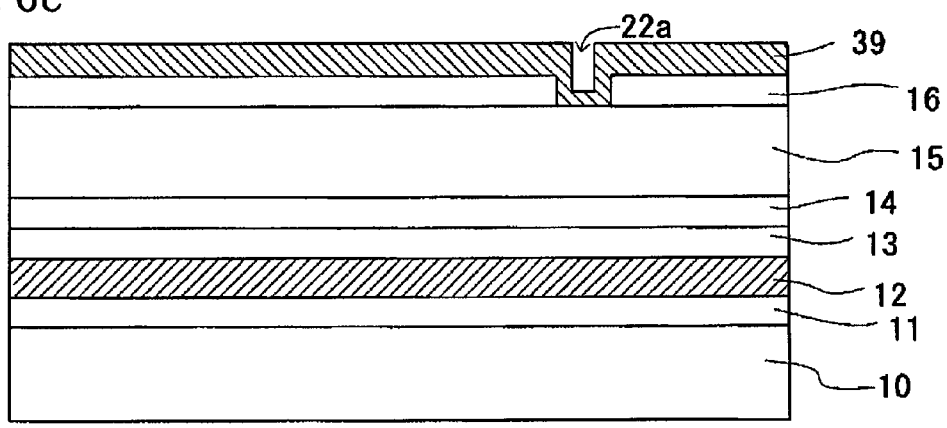
FIG. 6(c) is a cross-sectional view corresponding to the cross-sectional view of FIG. 2(b) in which an SiO2 film is formed by a thermal CVD process.
Figure 8A:
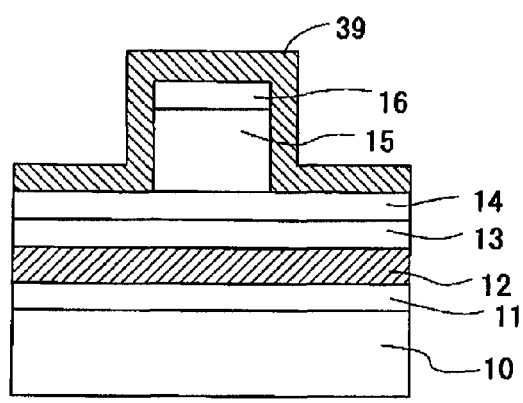
FIG. 8(a) is a cross-sectional view corresponding to the cross-sectional view of FIG. 2(a) in which an SiO2 film is formed by a thermal CVD process.

Next, an SiO2 film 39 is formed over the substrate 10 by using a thermal CVD (chemical vapor deposition) process (FIG. 6(c) and FIG. 8(a)).

Figure 7A:
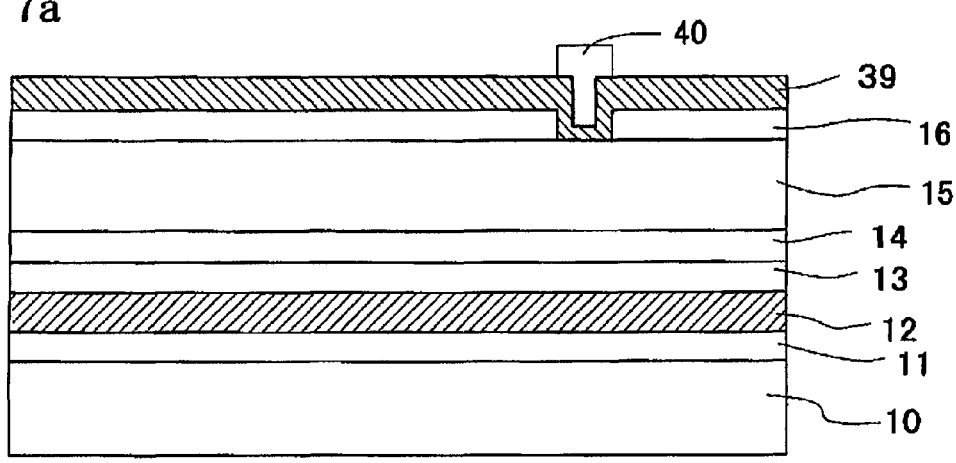
FIG. 7(a) is a cross-sectional view corresponding to the cross-sectional view of FIG. 6(c) in which a mask is formed on the electrical separating groove.
Figure 7B:
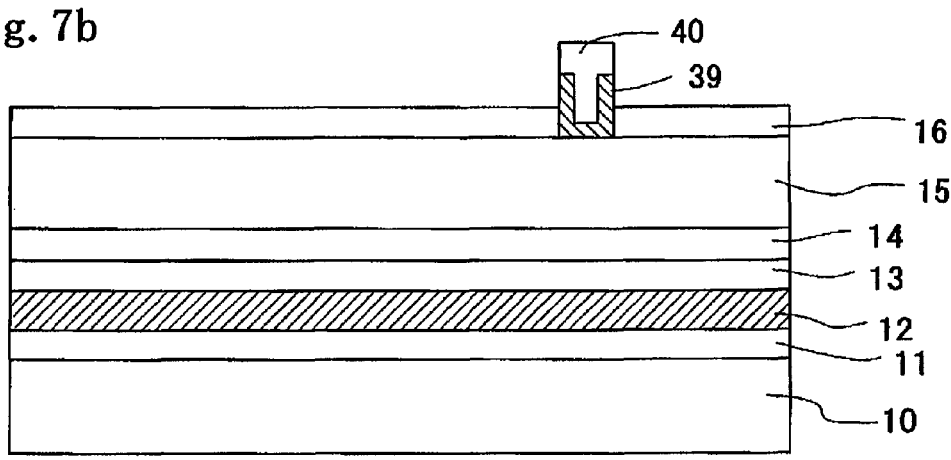
FIG. 7(b) is a cross-sectional view corresponding to the cross-sectional view of FIG. 7(a) from which the SiO2 film is removed by an etching process except for the electrical separating groove.
Figure 7C:
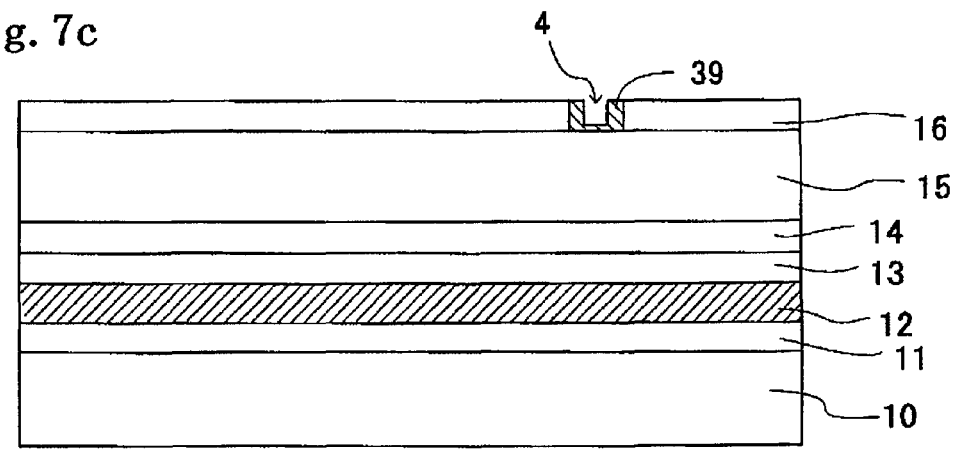
FIG. 7(c) is a cross-sectional view corresponding to the cross-sectional view of FIG. 7(b) from which the mask is removed.

Then, a mask 40 for an etching process is formed on the SiO2 film 39 by the photolithography process using the stepper so as to conform with both a plane configuration except for the multi-mode interference optical waveguide 1, the first group of optical waveguides 2 and the second group of optical waveguides 3 and a plane configuration of the electrical separating groove 4 shown in FIG. 1 (FIG. 7(*a*) and FIG. 8(*b*)).

Thereafter, with using the mask 40, the SiO2 film 39, which lies on the multi-mode interference optical waveguide 1 except for the separating groove region 22*a*, the first group of optical waveguides 2 and the second group of optical waveguides 3, is subjected to a wet etching process by using an etching solution containing a BHF (buffered hydrofluoric acid), so as to be removed therefrom (FIG. 7(*b*) and FIG. 8(*c*)).

Then, the mask 40, which lies on the area except for the first group of optical waveguides 2 and the second group of optical waveguides 3, and on the separating groove region 22*a*, is removed by using the chemical solution and the ashing process (FIG. 7(*c*) and FIG. 8(*d*)).

Then, a photoresist layer, which is not shown in the drawings, is formed on the contact layer 16 by the photolithography process using the stepper so as to confirm with a plane configuration of the multi-mode interference optical waveguide 1 except for the separating groove region 22*a*, the first group of optical waveguides 2 and the second group of optical waveguides 3 shown in FIG. 1.

Then, a Ti/Pt/Au electrode material layer, which is to be defined as an external electrode (i.e., a front electrode) for exciting the active layer by supply of a bias current, is formed over the substrate 10 by using an electron-beam evaporation process.

Thereafter, the photoresist layer, which is not shown in the drawing, is removed together with the Ti/Pt/Au electrode material lying thereon, by a lift-off process using an chemical solution.

Note, in this embodiment, although the front surface electrode is formed on the contact layer 16 in the main exciting region 21 and the saturable absorbing region 22 except for the separating groove region 22*a*, the front surface electrode may be formed on only the main exciting region 21 if an electrical connection is established between the main exciting region 21 and the saturable absorbing region 22. Also, the front surface electrode may be formed on all the area of the substrate 10 except for the saturable absorbing region 22 (including the separating groove region 22*a*). Optionally, the front surface electrode may be formed on the main exciting region 21 and the separating groove region 22*a*. Further, the front surface electrode may be formed on all the area of the substrate 10 except for the saturable absorbing region 22 (excluding the separating groove region 22*a*).

On the other hand, a front surface electrode may be formed on the saturable absorbing region 22 so that a bias current can be injected into the saturable absorbing region 22. With this arrangement, when a sufficient bistable hysteresis window can be obtained, it is possible to lower an operating current at the sacrifice of the bistable hysteresis window by injecting the bias current into the saturable absorbing region 22.

Thereafter, the rear surface of the substrate 10, in which no optical waveguide is formed, is polished, and a Ti/Pt/Au layer, which is not shown in the drawing, is formed on all the rear surface of the substrate 10 as an external electrode (a rear surface electrode) for exciting the active layer by supply of a bias current, using the electron-beam evaporation process.

Then, the substrate 10, on which a plurality of bistable elements 100 are formed, is cut along the boundaries between the adjacent bistable elements 100 so that the individual bistable elements 100 are separated from each other, whereby it is possible to obtain the individual bistable elements as shown in FIG. 1.

Note, in the production method according to this embodiment, although the stepper is used in the photolithography process, the production method is not necessarily limited to only the use of the stepper. For example, a vector scan electron exposure system may be applied to the production method.

Also, in the production method according to this embodiment, although the thermal CVD process is used for the formation of the SiO2 film 39, for example, a plasma CVD process or a sputtering process may be applied to the production method.

Further, in the production method according to this embodiment, although the ICP process is used as an etching process in the step in which the ridge structure is formed, the production method is not necessarily limited to only the use of the ICP process. For example, an RIE (reactive ion etching) process, a wet etching process or an NLD (magnetic neutral loop discharge) process may be applied to the production method.

Further, in the production method according to this embodiment, although the MOCVD process is used as the epitaxial growth process, the production method is not necessarily limited to only the MOCVD process. For example, an MBE (molecular beam epitaxy) process may be applied to the production method.

Also, in the production method according to this embodiment, although the lift-off process is used for the formation of the front surface electrode, the production method is not necessarily limited to the use of the lift-off process. For example, a method, in which a formation of an electrode pattern is carried out by using a photolithography process, and in which a disused Ti/Pt/Au electrode material is removed by using a milling process or the like, may be applied to the production method.

Also, in the bistable element 100 according to this embodiment, the electrical separating groove 4 is formed in the multi-mode interference optical waveguide 1 so that the main exciting region 21 and the saturable absorbing region 22 are isolated from each other. Nevertheless, if the bitable element is constituted so that the saturable absorbing region 22 cannot be supplied with a bias current, no formation of the electrical separating groove 4 is necessary, but it is considered that, for example, the contact layer 16 is removed from all the saturable absorbing region 22.

In this case, it is considered that steps as shown in FIGS. 9 and 10 are substituted for the steps shown in FIGS. 6 and 7.

First, a mask 38 for an etching process is formed on the contact layer 16 and the etching stopper layer 14 by the photolithography process using the stepper so as to conform with the plane configuration, except for the region to be defined as the saturable absorbing region 22, shown in FIG. 1 (FIG. 9(*a*)).

With using the mask 38, the contact layer 16 is subjected to a wet etching process using a sulfuric-acid-based etching solution so as to be removed from the region to be defined as the saturable absorbing region 22 (FIG. 9(*b*)).

Thereafter, the mask 38, which lies on the contact layer 16 and the etching stopper layer 14 except for the saturable absorbing region 22, is removed by using the chemical solution and the ashing process (FIG. 9(*c*)).

Next, an SiO2 film 39 is formed over the substrate 10 by using the thermal CVD (chemical vapor deposition) process (FIG. 9(*d*) and FIG. 8(*a*)).

Figure 8B:
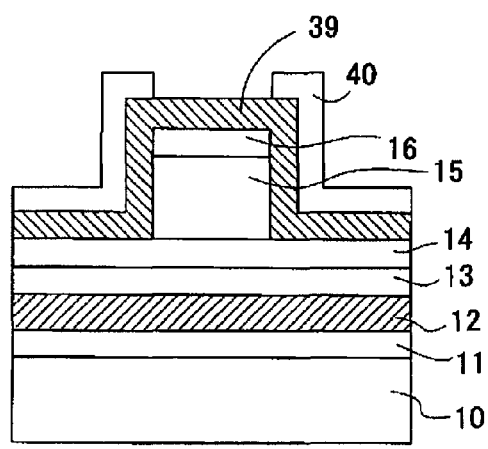
FIG. 8(b) is a cross-sectional view corresponding to the cross-sectional view of FIG. 8(a) in which a mask is formed on an area except for an optical waveguide.
Figure 10A:
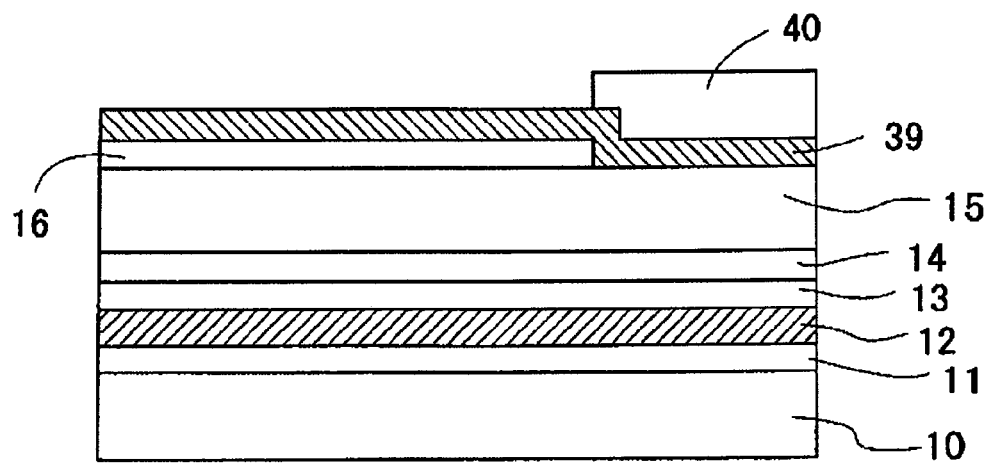
FIG. 10(a) is a cross-sectional view corresponding to the cross-sectional view of FIG. 9(d) in which a mask is formed on a saturable absorbing region.

Then, a mask 40 for an etching process is formed on the SiO2 film 39 by the photolithography process using the stepper so as to conform with a plane configuration except for the region to be defined as the main exciting region 21 shown in FIG. 1 (FIG. 10(a) and FIG. 8(b)).

Figure 8C:
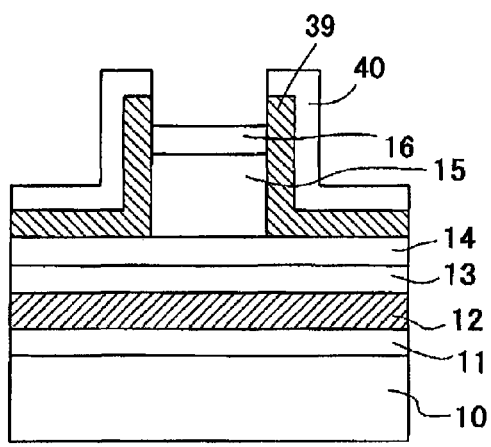
FIG. 8(c) is a cross-sectional view corresponding to the cross-sectional view of FIG. 8(b) from which the SiO2 film on the optical waveguide is removed by an etching process except for the electrical separating groove.
Figure 10B:
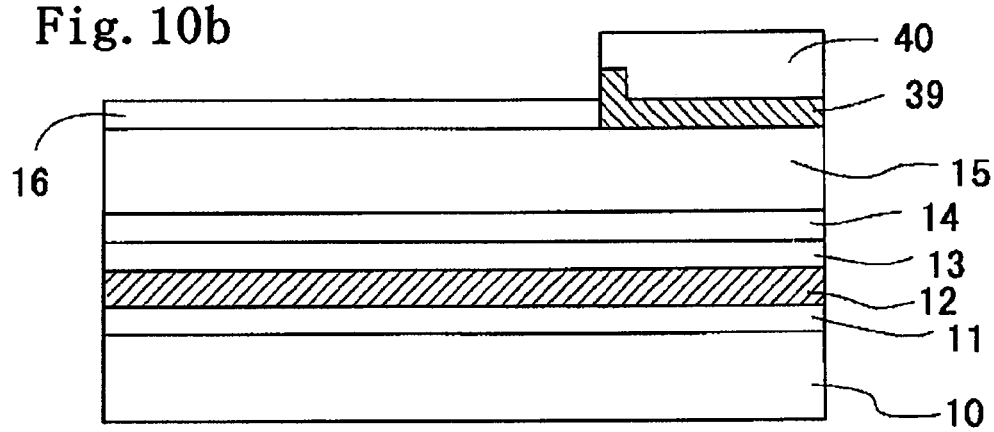
FIG. 10(b) is a cross-sectional view corresponding to the cross-sectional view of FIG. 10(a) from which the SiO2 film is removed by an etching process.

Thereafter, with using the mask 40, the SiO2 film 39, which lies on the region to be defined as the main exciting region 21, is subjected to a wet etching process by using the etching solution containing the BHF (buffered hydrofluoric acid), so as to be removed therefrom (FIG. 10(b) and FIG. 8(c)).

Figure 8D:
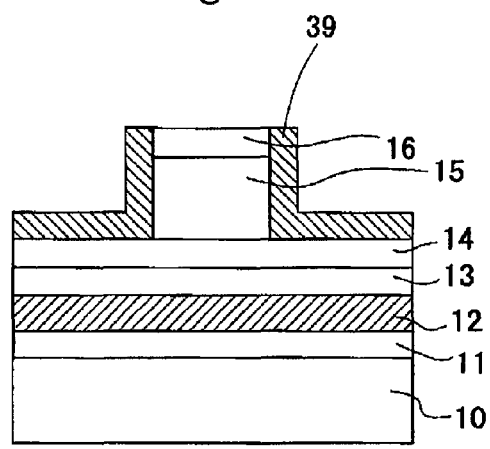
FIG. 8(d) is a cross-sectional view corresponding to the cross-sectional view of FIG. 8(c) from which the mask is removed.
Figure 9A:
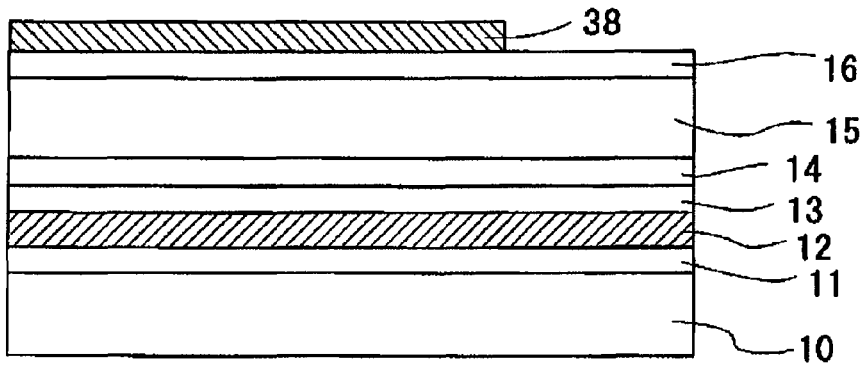
FIG. 9(a) is a cross-sectional view corresponding to the cross-sectional view taken along the B-B' line in the bistable element shown in FIG. 1, in which a mask is formed.
Figure 9B:
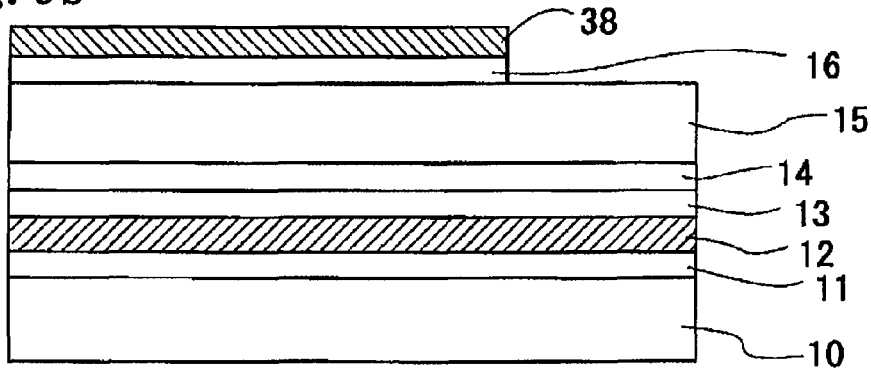
FIG. 9(b) is a cross-sectional view corresponding to the cross-sectional view of FIG. 9(a) from which a contact layer is removed by an etching process for except a main exciting region.
Figure 9C:
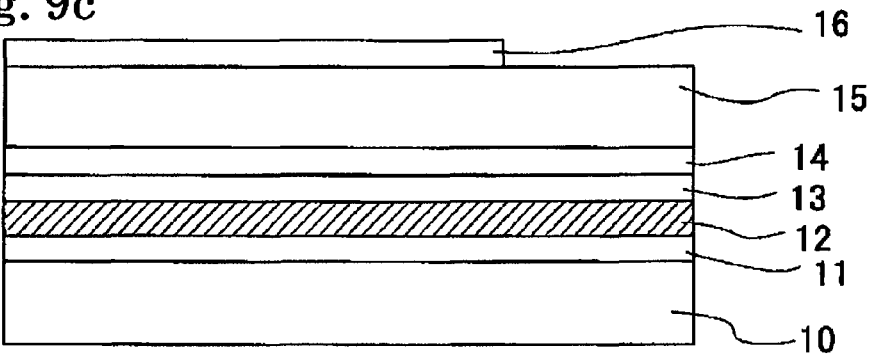
FIG. 9(c) is a cross-sectional view corresponding to the cross-sectional view of FIG. 9(b) from which the mask is removed.
Figure 9D:
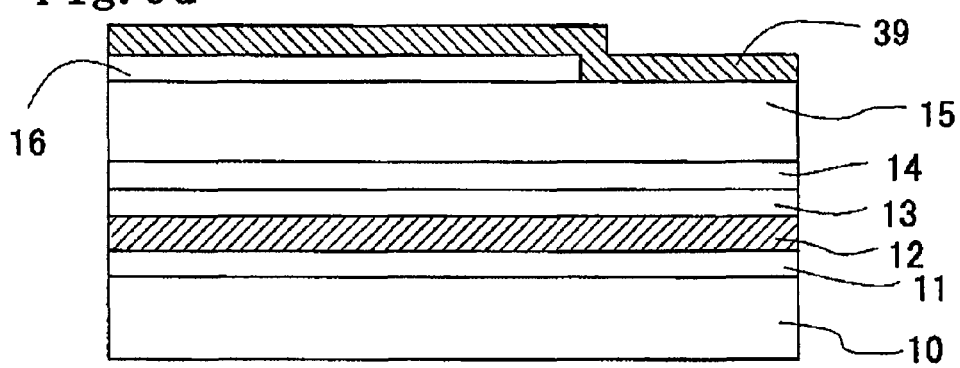
FIG. 9(d) is a cross-sectional view corresponding to FIG. 9(c) in which a SiO2 film is formed by a thermal CVD process.
Figure 10C:
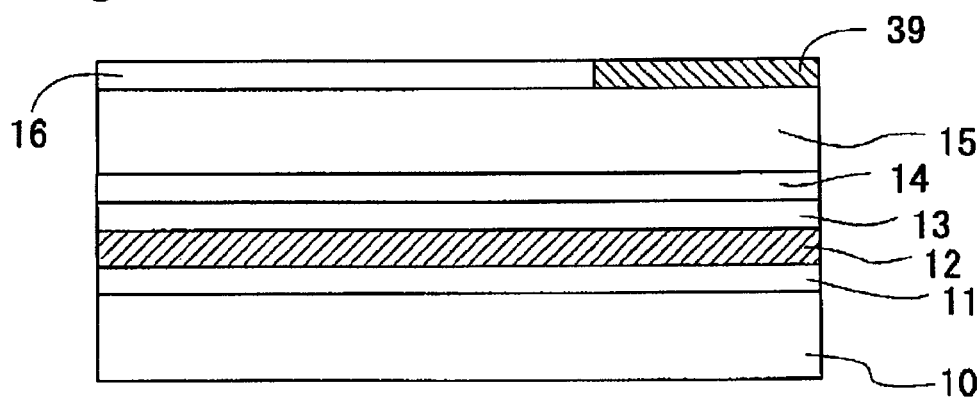
FIG. 10(c) is a cross-sectional view corresponding to the cross-sectional view of FIG. 10(b) from which the mask is removed.

Then, the mask 40, which lies on the area except for the region to be defined as the main exciting region 21, is removed by using the chemical solution and the ashing process (FIG. 10(c) and FIG. 8(d)).

Then, a photoresist layer, which is not shown in the drawings, is formed on the contact layer 16 of the region to be defined as the main exciting region 21 by the photolithography process using the stepper.

Then, a Ti/Pt/Au electrode material layer, which is to be defined as an external electrode (i.e., a front electrode) for exciting the active layer by supply of a bias current, is formed over the substrate 10 by the electron-beam evaporation process.

Thereafter, the photoresist layer, which is not shown in the drawing, is removed together with the Ti/Pt/Au electrode material lying thereon, by a lift-off process using an chemical solution.

As stated hereinbefore, in the bistable element 100 according to this embodiment, the multi-mode interference optical waveguide 1 includes the part of the saturable absorbing region 22, with the part of the saturable absorbing region being defined as the region (i.e., the non-cross-gain restraint region) in which the zero-order mode light and the first-order mode light defined as light propagating modes are not superimposed over each other. Thus, the main exciting region 21 can be defined as the cross-gain restraint region in which the zero-order mode light and the first-order mode light can be sufficiently superimposed over each other, and thus there are merits or advantages that it is possible to obtain a very wide hysteresis window.

In particular, the part of the saturable absorbing region 22, which is included in the multi-mode interference optical waveguide 1, is defined as a region having the region width which is equal to the waveguide width of the multi-mode interference optical waveguide 1, and the region width which is equal to the partial waveguide length of the multi-mode interference optical waveguide 1 measured from the one end face 1a to the predetermined location, with the part of the saturable absorbing region 22 being the region of the multi-mode interference optical waveguide 1 measured from the one end face 1a to the predetermined location. Thus, there are merits or advantages that it is possible to easily set a separation between the main exciting region 21 and the saturable absorbing region 22.

Note, in the bistable element 100 according to this embodiment, although the part of the saturable absorbing region 22, which is included in the multi-mode interference optical waveguide 1, is defined as the region (i.e., the non-cross-gain restraint region) in which the zero-order mode light and the first-order mode light defined as light propagating modes are not superimposed over each other, the part concerned may be in the region (i.e., the cross-gain restraint region) in which the zero-order mode light and the first-order mode light are superimposed over each other.

Also, in the bistable element 100 according to this embodiment, although the first group of optical waveguides 2 forms the other part of the saturable absorbing region 22, only the part of the saturable absorbing region 22, which is included in the multi-mode interference optical waveguide 1, may be defined as the saturable absorbing region 22 without the first group of optical waveguides 2 being defined as the other part of the saturable absorbing region 22.

In these cases, with the arrangement of the conventional bistable element in which only the part of the first group of optical waveguides 2 is defined as the saturable absorbing region 22, since the saturable absorbing region 22 can be provided in the multi-mode interference optical waveguide 1, it is unnecessary to lengthen the first group of optical waveguides 2 to secure the saturable absorbing region 22, resulting in miniaturization of the bistable element 100.

Nevertheless, the larger an area of the part of the saturable absorbing region 22 which is included in the multi-mode interference optical waveguide 1, the wider the bistable hysteresis window. Thus, a value of an electric current for operating the bistable element 100 is increased so that an electric power consumption becomes larger in an integrated circuit device featuring the bistable element 100. That is, there is a tradeoff between the widening of the bistable hysteresis window and the lowering of the electric power consumption in the integrated circuit device. Thus, preferably, the area of the part of the saturable absorbing region 22, which is included in the multi-mode interference optical waveguide 1, should be suitably set in accordance with specifications of the integrated circuit device.

In particular, more preferably, a part of the saturable absorbing region 22 is defined in the non-cross-gain restraint region in the multi-mode interference optical waveguide 1, and the other part of saturable absorbing region 22 should be secured in the first group of optical waveguides 2 so as to compensate a shortage of an area of the saturable absorbing region 22. According to this arrangement, in the bistable element 100, it is possible to obtain merits or advantages that not only can the electric power consumption of the integrated circuit device be suppressed, but also it is possible to widen the bistable hysteresis window while suppressing the length of the first group of optical waveguides 2 at the minimum.

Second Embodiment

Figure 11A:
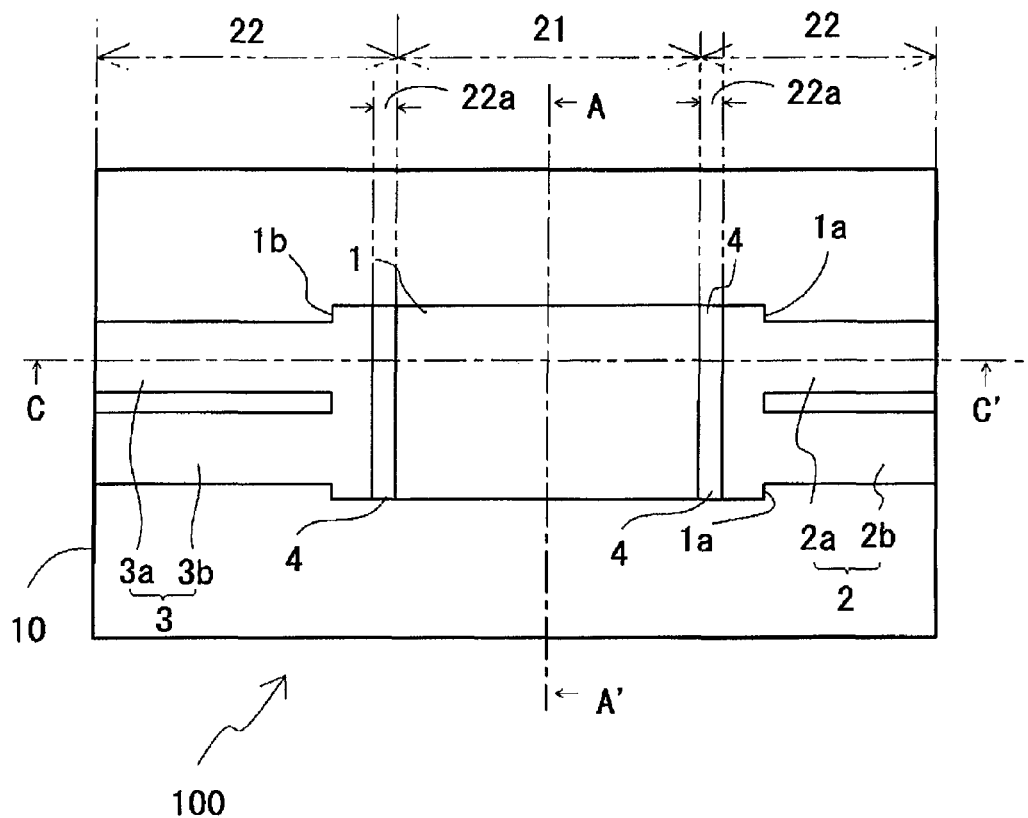
FIG. 11(a) is a plan view showing an example of a schematic structure of a bistable element according to a second embodiment.
Figure 11B:
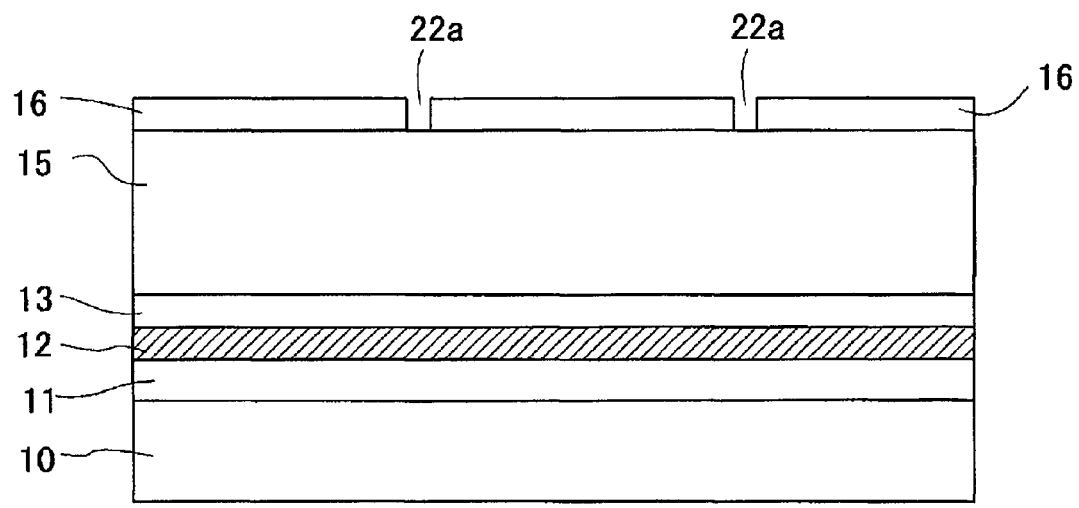
FIG. 11(b) is a cross-sectional view taken along the C-C' line in the bistable element shown in FIG. 11(a).

FIG. 11(a) is a plan view showing an example of a schematic structure of a bistable element according to the second embodiment, and FIG. 11(b) is a cross-sectional view taken along the C-C' line in the bistable element shown in FIG. 11(a). In FIG. 11, the same references as in FIGS. 1 to 10 indicate similar elements or corresponding elements, and thus explanations for these elements are omitted.

A multi-mode interference optical waveguide 1 has two ports formed in one end face 1a thereof, and two ports formed in the other end face 1b thereof. In particular, the multi-mode interference optical waveguide 1 is defined as a generally-rectangular interference region having a waveguide length of about 135 µm, which is set based on the above-mentioned formula (1), and a waveguide width of about 7.4 µm.

Also, two saturable absorbing regions 22 have respective parts which are included in the multi-mode interference optical waveguide 1, and each of the respective parts of the saturable absorbing regions 22 is defined as a region in which a zero-order mode light and a first-order mode light defined as light propagating modes are not superimposed over each other.

For example, the part of one of the saturable absorbing regions 22, which is included in the multi-mode interference optical waveguide 1, is defined as a region having a region width which is equal to the waveguide width of the multimode interference optical waveguide 1, and a region length which is equal to a partial waveguide length of the multi-mode interference optical waveguide 1 measured from the one end face 1*a* to a predetermined location, with the part of the one saturable absorbing region 22 being the region of the multi-mode interference optical waveguide 1 measured from the one end face 1*a* to the predetermined location. Also, the part of the other saturable absorbing region 22, which is included in the multi-mode interference optical waveguide 1, is defined as a region having a region width which is equal to the waveguide width of the multi-mode interference optical waveguide 1, and a region length which is equal to a partial waveguide length of the multi-mode interference optical waveguide 1 measured from the other end face 1*b* to a predetermined location, with the part of the other saturable absorbing region 22 being the region of the multi-mode interference optical waveguide 1 measured from the other end face 1*b* to the predetermined location.

In particular, in this embodiment, the respective parts of the saturable absorbing regions 22, which are included in the multi-mode interference optical waveguide 1, have the same region lengths of about 29 μm (25 μm except for each of separating grooves 4), which are measured from the respective end faces 1*a* and 1*b* of the multi-mode interference optical waveguide 1 to the predetermined locations.

A first group of optical waveguides 2 includes two optical waveguides (a first optical waveguide 2*a* and a second optical waveguide 2*b*). Also, the first and second optical waveguides 2*a* and 2*b* are perpendicularly connected to the one end face 1*a* of the multi-mode interference optical waveguide 1 so as to be juxtaposed with each other.

In particular, each of the first and second optical waveguides 2*a* and 2*b* according to this embodiment is defined as a generally-rectangular linear waveguide having a waveguide length of about 50 μm, and a waveguide width of about 1.5 μm. Also, the optical waveguides (the first and second optical waveguides 2*a* and 2*b*) included in the first group 2 forms the other or remaining part of the one saturable absorbing region 22, with each of the optical waveguides, which form the other part of the one saturable absorbing region 22, having a region width and a region length which are respectively equal to the waveguide width and the waveguide length of the optical waveguide concerned. In short, each of the first and second optical waveguides 2*a* and 2*b* has no part included in the main exciting region 21, and forms only the other part of the one saturable absorbing region 22.

A second group of optical waveguides 3 includes two optical waveguides (a third optical waveguide 3*a* and a fourth optical waveguide 3*b*). Also, the third optical waveguide 3*a* is positioned so as to be opposite to the first waveguide 2*a* included in the first group 2, with the multi-mode interference optical waveguide 1 being intervened therebetween. Also, the fourth optical waveguide 3*b* is positioned so as to be opposite to the second waveguide 2*b* included in the first group 2, with the multi-mode interference optical waveguide 1 being intervened therebetween.

In particular, each of the third and fourth optical waveguides 3*a* and 3*b* according to this embodiment is defined as a generally-rectangular linear waveguide having a waveguide length of about 50 μm, and a waveguide width of about 1.5 μm. Also, the optical waveguides (the third and fourth optical waveguides 3*a* and 3*b*) included in the second group 3 forms the other or remaining part of the other saturable absorbing region 22, with each of the optical waveguides, which form the other part of the other saturable absorbing region 22, having a region width and a region length which are respectively equal to the waveguide width and the waveguide length of the optical waveguide concerned. In short, each of the third and fourth optical waveguides 3*a* and 3*b* has no part included in the main exciting region 21, and forms only the other part of the other saturable absorbing region 22.

Accordingly, in the stable element 100 according to this embodiment, the one saturable absorbing region 22 is defined by the first group of optical waveguides 2 and one part of the multi-mode interference optical waveguide 1 which is adjacent to the one end face 1*a* thereof, with the first group of optical waveguides 2 and the one part of the multi-mode interference optical waveguide 1 continuously extending as the one saturable absorbing region 22. The other saturable absorbing region 22 is defined by the second group of optical waveguides 3 and another part of the multi-mode interference optical waveguide 1 which is adjacent to the other end face 1*b* thereof, with the second group of optical waveguides 3 and the other part of the multi-mode interference optical waveguide 1 continuously extending as the other saturable absorbing region 22. The respective saturable absorbing regions 22 on the sides of the first and second groups of optical waveguides 2 and 3 have the same region length of about 79 μm (75 μm except for the corresponding respective electrical separating groove 4). Also, in the stable element 100 according to this embodiment, the main exciting region 21 is defined by the remaining part of the multi-mode interference optical waveguide 1.

Note, since a production method of the bistable element 100 according to this embodiment is similar to the above-mentioned production method of the bistable element 100 according to the first embodiment except that a mask 38 is used to form the electrical separating groove 4 in the multi-mode interference optical waveguide on the side of the second group of optical waveguides 3, and that an SiO2 film is left in the electrical separating groove 4 on the side of the second group of optical waveguides 3, an explanation for the production method is omitted.

Next, reference is made to a reason why a steady bistable operating range (i.e., a wide bistable hysteresis window) is obtained by the bistable element 100 according to the second embodiment, and why the bistable element 100 can be miniaturized.

A operating principle of the bistable element 100 according to the second embodiment is basically similar to that of the above-mentioned bistable element 100 according to the first embodiment, and it is possible to theoretically obtain the substantially complete superimposition region (i.e., the cross-gain restraint region) between the two optical waveguide paths in the main exciting region 21, by defining the regions (i.e., the non-cross-gain restraint region), in which the superimposition of the two optical waveguide paths is not almost obtained, as the saturable absorbing regions in the multi-mode interference optical waveguide 1.

On the basis of this principle, in the second embodiment, both the side regions of the multi-mode interference optical waveguide 1, in each of which the superimposition of the two optical waveguide paths is not almost obtained, are defined as the respective saturable absorbing regions 22, whereby it is possible to obtain the wide bistable saturable window.

Note, the second embodiment is different from the first embodiment in that the multi-mode interference optical waveguide 1 has the two ports formed in the one end face 1*a*, and the two ports formed in the other end face 1*b*, and, except for merits or advantages obtained from this arrangement of the multi-mode interference optical waveguide1, the second embodiment features the merits or advantages similar to those of the first embodiment.

Third Embodiment

Figure 12A:
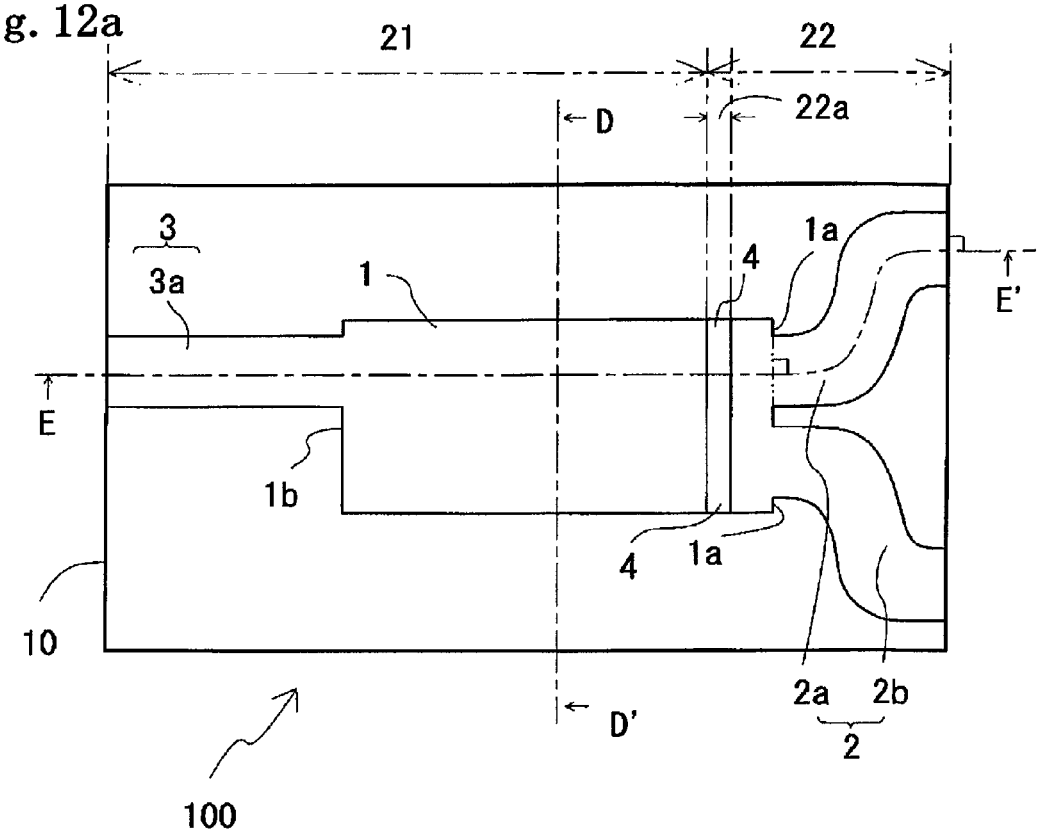
FIG. 12(a) is a plan view showing an example of a schematic structure of a bistable element according to a third embodiment.
Figure 12B:
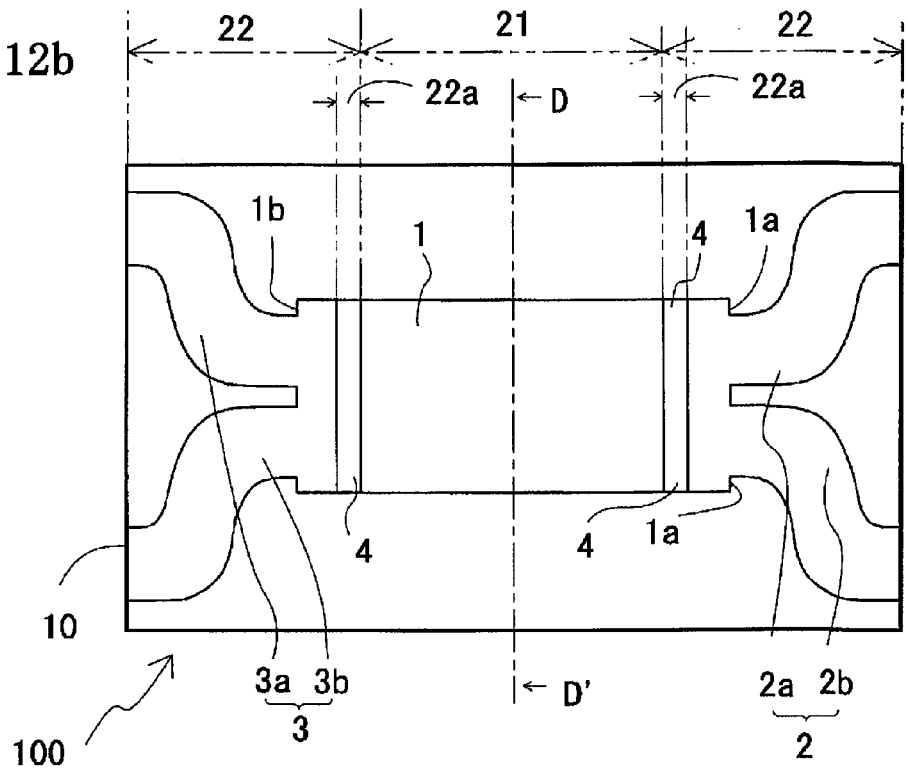
FIG. 12(b) is a plan view showing another example of a schematic structure of a bistable element according to the third embodiment.
Figure 13A:
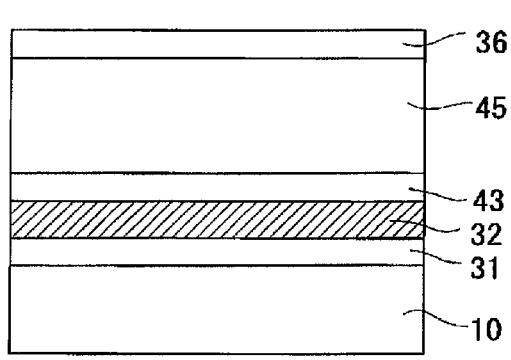
FIG. 13(a) is a cross-sectional view corresponding to a cross-sectional view taken along the D-D' line in the bistable element shown in FIG. 12, in which a epitaxial structure is produced by an MOCVD process.
Figure 13B:
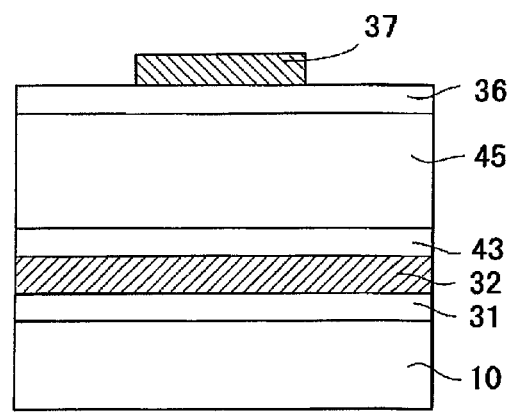
FIG. 13(b) is a cross-sectional view corresponding to the cross-sectional view of FIG. 13(a) in which a mask is formed.
Figure 13C:
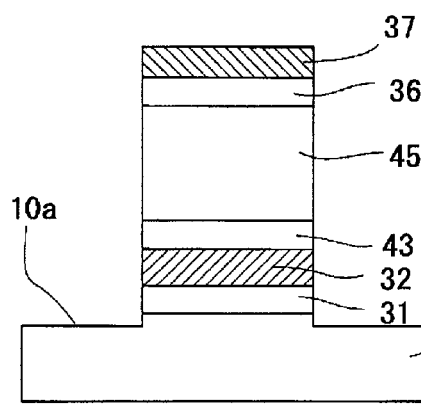
FIG. 13(c) is a cross-sectional view corresponding to the cross-sectional view of FIG. 13(b) in which a high-mesa structure formed by an etching process.
Figure 13D:
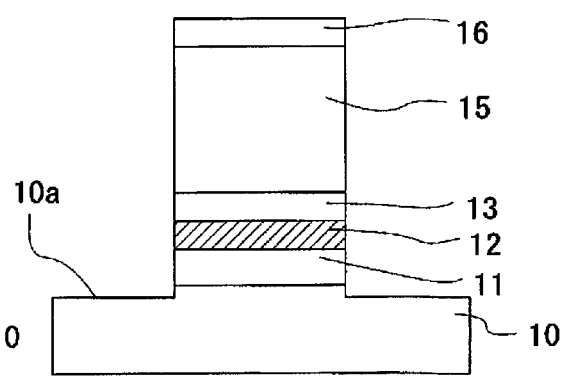
FIG. 13(d) is a cross-sectional view corresponding to the cross-sectional view of FIG. 13(c) from which the mask is removed.
Figure 14A:
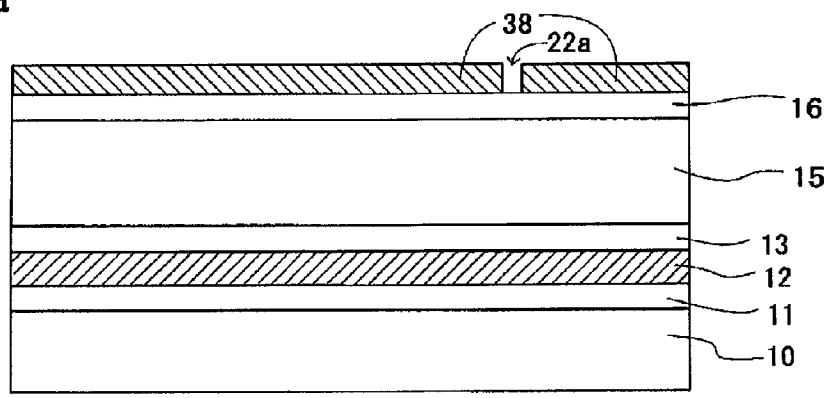
FIG. 14(a) is a cross-sectional view corresponding to a cross-sectional view taken along the E-E' line in the bistable element shown in FIG. 12(a), in which a mask for an electrical separating groove is formed.
Figure 14B:
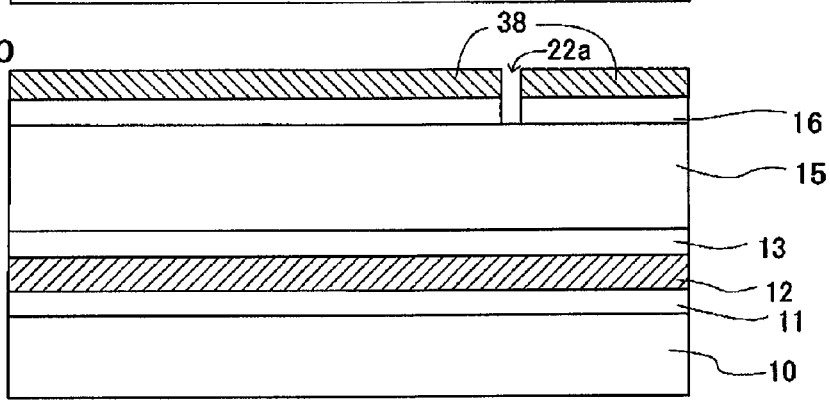
FIG. 14(b) is a cross-sectional view corresponding to the cross-sectional view of FIG. 14(a) in which the electrical separating groove is formed by an etching process.
Figure 14C:
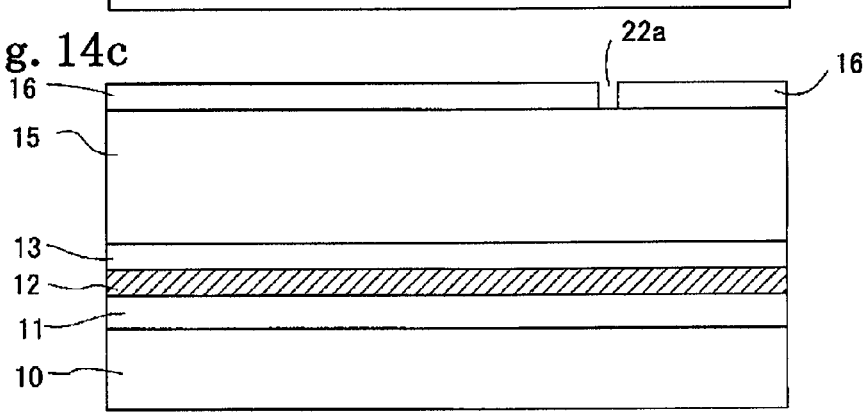
FIG. 14(c) is a cross-sectional view corresponding to the cross-sectional view of FIG. 13(b) from which the mask is removed.
Figure 14D:
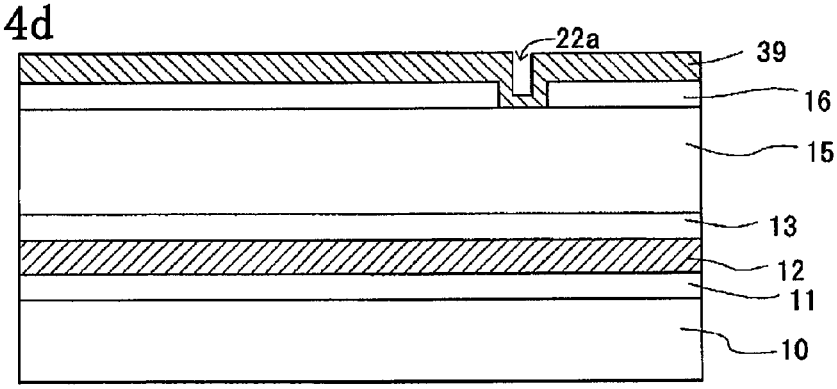
FIG. 14(d) is a cross-sectional view corresponding to the cross-sectional view of FIG. 14(c) in which an SiO2 film is formed by a thermal CVD process.
Figure 15A:
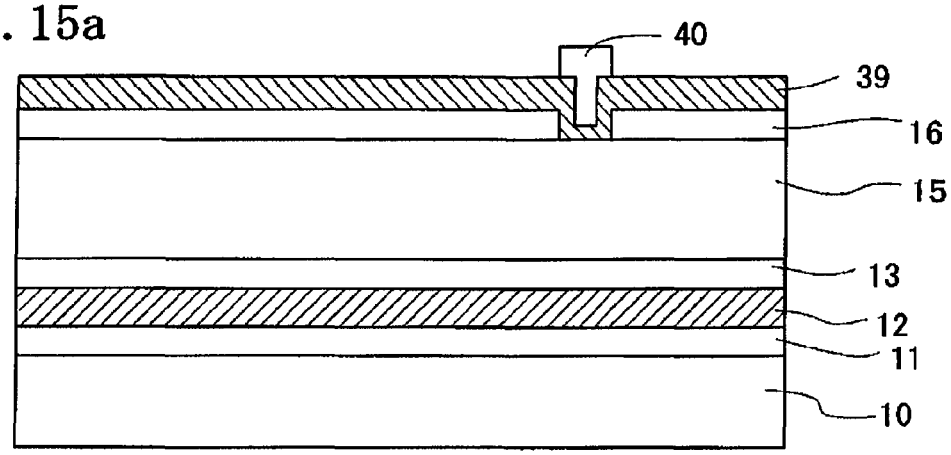
FIG. 15(a) is a cross-sectional view corresponding to the cross-sectional view of FIG. 14(d) in which a mask is formed on the electrical separating groove.
Figure 15B:
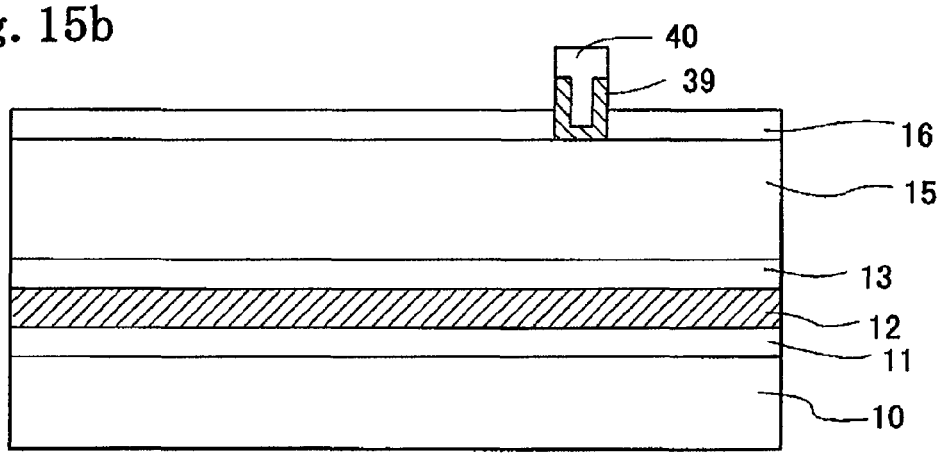
FIG. 15(b) is a cross-sectional view corresponding to the cross-sectional view of FIG. 15(a) from which the SiO2 film is removed by an etching process except for the electrical separating groove.
Figure 15C:
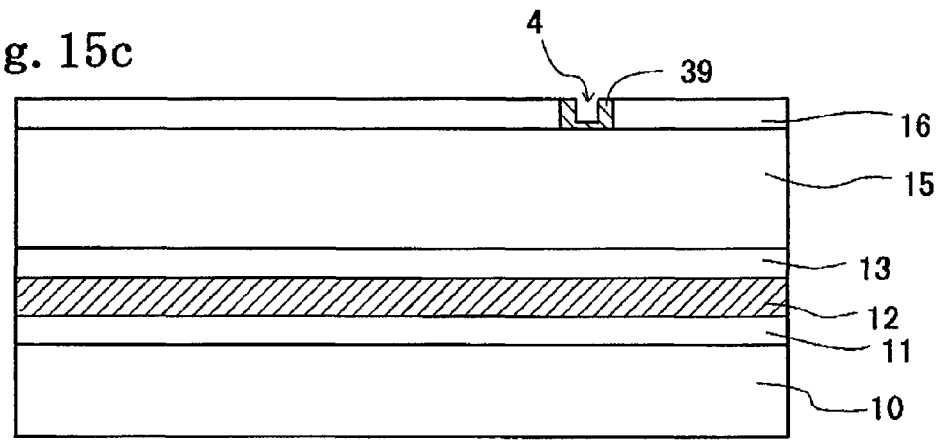
FIG. 15(c) is a cross-sectional view corresponding to the cross-sectional view of FIG. 15(b) from which the mask is removed.
Figure 16A:
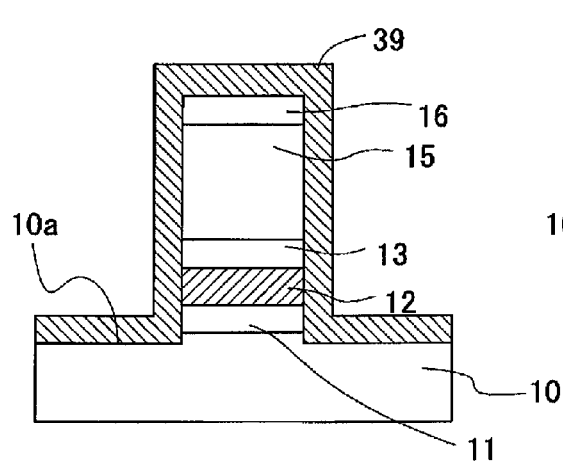
FIG. 16(a) is a cross-sectional view corresponding to the cross-sectional view of FIG. 13(d) in which an SiO2 film is formed by a thermal CVD process.
Figure 16B:
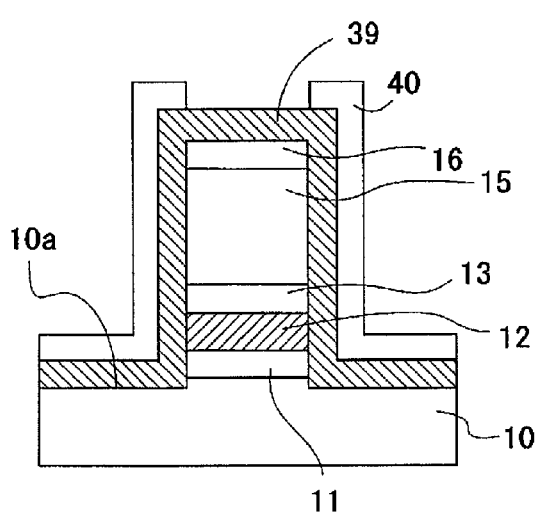
FIG. 16(b) is a cross-sectional view corresponding to the cross-sectional view of FIG. 16(a) in which a mask is formed on an area except for an optical waveguide.
Figure 16C:
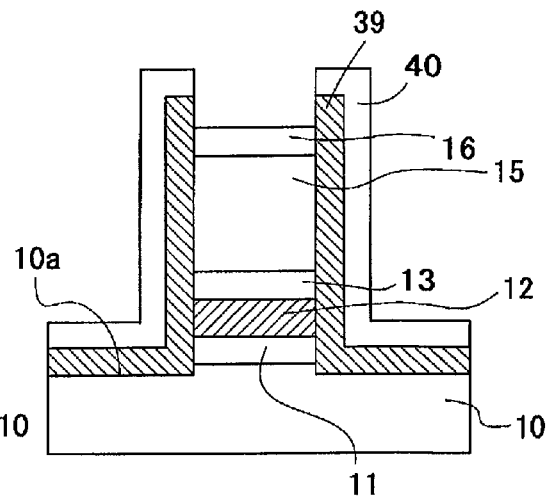
FIG. 16(c) is a cross-sectional view corresponding to the cross-sectional view of FIG. 16(b) from which the SiO2 film on the optical waveguide is removed by an etching process except for the electrical separating groove.
Figure 16D:
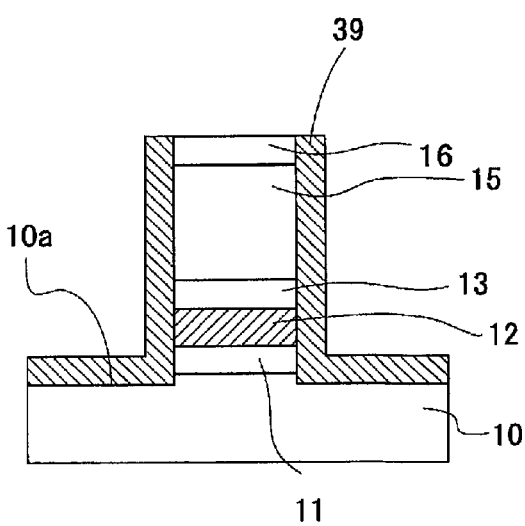
FIG. 16(d) is a cross-sectional view corresponding to the cross-sectional view of FIG. 16(c) from which the mask is removed.
Figure 17A:
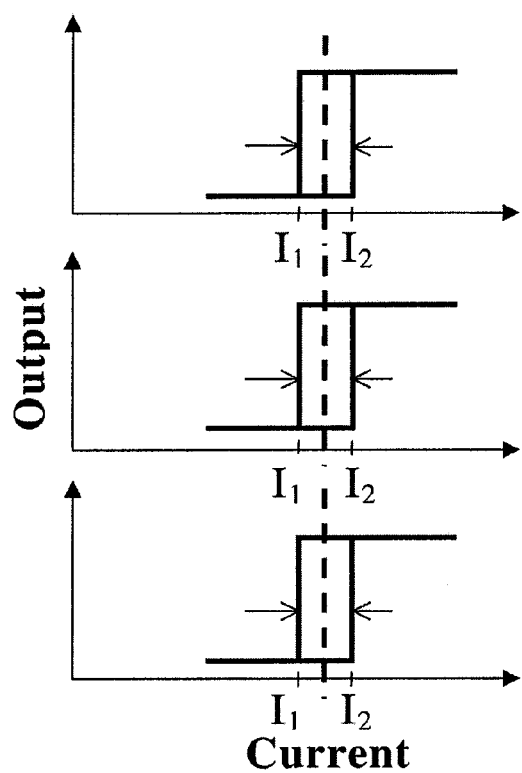
FIG. 17(a) is a view showing a bistable hysteresis window in a conventional bistable element.
Figure 17B:
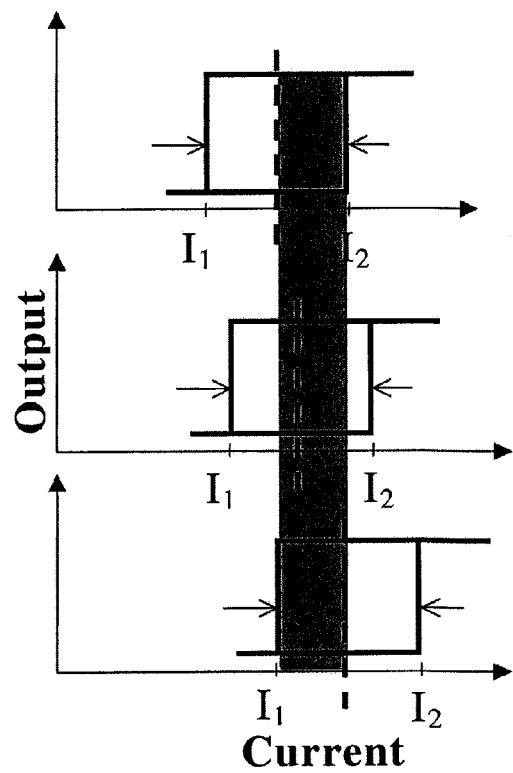
FIG. 17(b) is a view showing a bistable hysteresis window in a bistable element according to the present invention.

FIG. 12(a) is a plan view showing an example of a schematic structure of a bistable element according to a third embodiment; and FIG. 12(b) is a plan view showing another example of a schematic structure of a bistable element according to the third embodiment. FIG. 13(a) is a cross-sectional view corresponding to a cross-sectional view taken along the D-D' line in the bistable element shown in FIG. 12, in which a epitaxial structure is produced by an MOCVD process; FIG. 13(b) is a cross-sectional view corresponding to the cross-sectional view of FIG. 13(a) in which a mask is formed; FIG. 13(c) is a cross-sectional view corresponding to the cross-sectional view of FIG. 13(b) in which a high-mesa structure formed by an etching process; and FIG. 13(d) is a cross-sectional view corresponding to the cross-sectional view of FIG. 13(c) from which the mask is removed. FIG. 14(a) is a cross-sectional view corresponding to a cross-sectional view taken along the E-E' line in the bistable element shown in FIG. 12(a), in which a mask for an electrical separating groove is formed; FIG. 14(b) is a cross-sectional view corresponding to the cross-sectional view of FIG. 14(a) in which the electrical separating groove is formed by an etching process; FIG. 14(c) is a cross-sectional view corresponding to the cross-sectional view of FIG. 13(b) from which the mask is removed; and FIG. 14(d) is a cross-sectional view corresponding to the cross-sectional view of FIG. 14(c) in which an SiO2 film is formed by a thermal CVD process. FIG. 15(a) is a cross-sectional view corresponding to the cross-sectional view of FIG. 14(d) in which a mask is formed on the electrical separating groove; FIG. 15(b) is a cross-sectional view corresponding to the cross-sectional view of FIG. 15(a) from which the SiO2 film is removed by an etching process except for the electrical separating groove; and FIG. 15(c) is a cross-sectional view corresponding to the cross-sectional view of FIG. 15(b) from which the mask is removed. FIG. 16(a) is a cross-sectional view corresponding to the cross-sectional view of FIG. 13(d) in which an SiO2 film is formed by a thermal CVD process; FIG. 16(b) is a cross-sectional view corresponding to the cross-sectional view of FIG. 16(a) in which a mask is formed on an area except for an optical waveguide; FIG. 16(c) is a cross-sectional view corresponding to the cross-sectional view of FIG. 16(b) from which the SiO2 film on the optical waveguide is removed by an etching process except for the electrical separating groove; and FIG. 16(d) is a cross-sectional view corresponding to the cross-sectional view of FIG. 16(c) from which the mask is removed. In FIGS. 12 to 16, the same references as in FIGS. 1 to 11 indicate similar elements or corresponding elements, and thus explanations for these elements are omitted.

In a first group of optical waveguides 2, comparing with a space between respective end faces of the two adjacent optical waveguides (each of which is defined as a boundary face between the multi-mode interference optical waveguide 1 and the optical waveguide concerned), a space between the respective other end faces of the two adjacent optical waveguides (each of which is defined as a light-incidence face and/or a light-emission face at a cut side face of a substrate 10) is wider, and the other end faces of the two adjacent optical waveguides are substantially parallel to the cut side face of the substrate 10. Also, at least one the two adjacent optical waveguides is defined as a curved waveguide (including either only a curved region or a curved region and a linear region) including a curved region (for example, see: FIG. 12). Note, in the first group of optical waveguides 2, a lengthwise direction of end portions of the optical waveguides in the vicinity of the end faces thereof is substantially perpendicular to the end face 1a of the multi-mode interference optical waveguide 1. Nevertheless, if a light-incidence requirement is fulfilled at the boundary between the multi-mode interference optical waveguide 1 and the optical waveguides, the aforesaid lengthwise direction may not be perpendicular to the end face 1a of the multi-mode interference optical waveguide 1. On the other hand, a lengthwise direction of end portions of the optical waveguides in the vicinity of the other end faces thereof must be substantially perpendicular to the cut side face of the substance 10 so that each of the other end faces of the optical waveguides included in the first group 2 is defined as a reflecting face.

In a case where a second group of optical waveguides 3 includes at least two optical waveguides, comparing with a space between respective end faces of the two adjacent optical waveguides (each of which is defined as a boundary face between the multi-mode interference optical waveguide 1 and the optical waveguide concerned), a space between the respective other end faces of the two adjacent optical waveguides (each of which is defined as a light-incidence face and/or a light-emission face at a cut side face of a substrate 10) is wider. To this end, at least one the two adjacent optical waveguides is defined as a curved waveguide (including either only a curved region or a curved region and a linear region) including a curved region (for example, see: FIG. 12(b)). Note, in the second group of optical waveguides 3, a lengthwise direction of end portions of the optical waveguides in the vicinity of the end faces thereof is substantially perpendicular to the end face 1b of the multi-mode interference optical waveguide 1. Nevertheless, if a light-incidence requirement is fulfilled at the boundary between the multi-mode interference optical waveguide 1 and the optical waveguides, the aforesaid lengthwise direction may not be perpendicular to the end face 1b of the multi-mode interference optical waveguide 1. On the other hand, a lengthwise direction of end portions of the optical waveguides in the vicinity of the other end faces thereof must be substantially perpendicular to a corresponding cut side face of the substance 10 so that each of the other end faces of the optical waveguides included in the first group 2 is defined as a reflecting face.

Note, in this embodiment, as shown in FIG. 12(a), reference will be made to an example in which the first group of optical waveguides 2 includes two optical waveguide (i.e., the first and second optical waveguides 2a and 2b), and in which the second group of optical waveguides 3 includes one optical waveguide (i.e., the third optical waveguide 3a) below.

Each of the first and second optical waveguides 2a and 2b includes a generally S-shaped curved region and linear regions. In comparison with the space between the respective end faces of the optical waveguides (each of which is defined as the boundary face between the multi-mode interference optical waveguide 1 and the optical waveguide concerned), the space between the respective other end faces of the optical waveguides (each of which is defined as the light-incidence face and/or the light-emission face at the corresponding cut side face of a substrate 10) is wider.

Note, the multi-mode interference optical waveguide 1, the first optical waveguide 2a, the second optical waveguide 2b and the third optical waveguide 3a have the same layer structure, and each of these optical waveguides is defined as a high-mesa waveguide. In particular, the multi-mode interference optical waveguide 1 has a waveguide length of about 140 μm, and a waveguide width of about 8 μm. Also, each of the first, second and third optical waveguides 2a, 2b and 3a has a waveguide length of about 3 μm.

As shown in FIG. 13(d), a cross-sectional structure of these elements is defined as a high-mesa structure in which a buffer layer 11 composed of an n-InP-based material forming an n-type semiconductor, a light-emitting layer 12 composed of an InGaAsP/InGaAsP-based material and defined as an active layer for realizing a bistable element featuring a long wavelength region (a 1.55 μm region), a first clad layer 13 composed of an i-InP-based material forming an intrinsic semiconductor, a second clad layer 15 composed of a p-InP-based material forming a p-type semiconductor, a contact layer 16 composed of a p-InGaAs-based material forming a p-type semiconductor are laminated in order on the substrate 10 composed of an n-InP-based material.

As shown in FIG. 13(d), the high-mesa structure corresponds to one in which the contact layer 16, the second clad layer 15, the first clad layer 13, the light-emitting layer 12 and buffer layer 11 are partially removed from a non-waveguide region by an etching process, with a part of the substrate 10 being simultaneously etched by the etching process.

Note, the light-emitting layer 12 is defined as a usual light-emitting layer featuring an SCH (separate confinement hetero-structure) and an MQW (multi-quantum well).

In particular, in this embodiment, the buffer layer 11 is about 100 nm in film thickness; the light-emitting layer 12 is 100 nm in film thickness; the first clad layer 13 is 100 nm in film thickness; the second clad layer 15 is 900 nm in film thickness; and the contact layer 16 is 150 nm in film thickness.

Next, with reference to FIGS. 13 to 16, a production method of the bistable element 100 according to this embodiment will now be explained.

First, an n-In film 31, a 1.55 μm wavelength region InGaAsP/InGaAsP film 32, an i-InP film 43, a p-InP film 45, and a p-InGaAs film 36 are deposited and laminated in order on a usual n-InP substrate 10 by using an MOVPE (metal-organic vapor phase Epitaxy) process (FIG. 13(a)).

Then, a mask 37 for an etching process is formed on the p-InGaAs film 36 by a usual photolithography process using a stepper (i.e., a lens reduction projection aligner) so as to conform with a plane configuration of the multi-mode interference optical waveguide 1, the first group of optical waveguides 2 and the second group of optical waveguides 3 shown in FIG. 12a (FIG. 13(b)).

With using the mask 37, the p-InGaAs film 36 to be defined as the contact layer 16, the p-InP film 45 to be defined as the second clad layer 15, the i-InP film 43 to be defined as the first clad layer 13, the 1.55 μm wavelength region InGaAsP/InGaAsP film 32 to be defined as the light-emitting layer 12, the n-InP film 31 to be defined as the buffer layer 11 are subjected to a dry etching process using an RIE (reactive ion etching) process, so that the disused portions of these films (on which the mask 37 is not formed) are removed, resulting in the formation of the high-mesa structure in the cross-sectional configuration (FIG. 13(c)). Note, as shown in FIG. 13(c), the etching reaches the surface of the substrate 10 so that the part of the substrate is etched, and the etched surface is indicated by reference 10a.

Thereafter, the mask 37, which lies on the contact layer 16, is removed by using an chemical solution and an ashing process (FIG. 13(d)).

Note, production steps stated hereinafter are directed to a separation of the high-mesa structure, including the multi-mode interference optical waveguide 1, the first group of optical waveguides 2 and the second group of optical waveguides 3, into the main exciting region 21 and the saturable absorbing region 22.

Then, a mask 38 for an etching process is formed on the contact layer 16 and the etched surface of the substrate 10 by the photolithography process using the stepper so as to conform with the plane configuration, except for the electrical separating groove 4, shown in FIG. 12(a) (FIG. 14(a)).

With using the mask 38, the contact layer 16 is subjected to a wet etching process using a sulfuric-acid-based etching solution so that the contact layer 16 is removed from a part (corresponding to the separating groove region 22a) of the multi-mode interference optical waveguide 1, at which the electrical separating groove 4 is to be defined (FIG. 14(b)).

Thereafter, the mask 38, which lies on the contact layer 16 and the etched surface of the substrate 10 except for the separating groove region 22a, is removed by using the chemical solution and the ashing process (FIG. 14(c)).

Next, an SiO2 film 39 is formed over the substrate 10 by using a thermal CVD (chemical vapor deposition) process (FIG. 14(d) and FIG. 16(a)).

Then, a mask 40 for an etching process is formed on the SiO2 film 39 by the photolithography process using the stepper so as to conform with both a plane configuration except for the multi-mode interference optical waveguide 1, the first group of optical waveguides 2 and the second group of optical waveguides 3 and a plane configuration of the electrical separating groove 4 shown in FIG. 12(a) (FIG. 15(a) and FIG. 16(b)).

Thereafter, with using the mask 40, the SiO2 film 39, which lies on the multi-mode interference optical waveguide 1 except for the separating groove region 22a, the first group of optical waveguides 2 and the second group of optical waveguides 3, is subjected to a wet etching process by using an etching solution containing a BHF (buffered hydrofluoric acid), so as to be removed therefrom (FIG. 15(b) and FIG. 16(c)).

Then, the mask 40, which lies on the area except for the first group of optical waveguides 2 and the second group of optical waveguides 3, and on the separating groove region 22a, is removed by using the chemical solution and the ashing process (FIG. 15(c) and FIG. 16(d)).

Then, a photoresist layer, which is not shown in the drawings, is formed on the contact layer 16 by the photolithography process using the stepper so as to confirm with a plane configuration of the multi-mode interference optical waveguide 1 except for the separating groove region 22a, the first group of optical waveguides 2 and the second group of optical waveguides 3 shown in FIG. 12(a).

Then, a Ti/Pt/Au electrode material layer, which is to be defined as an external electrode (i.e., a front electrode) for exciting the active layer by supply of a bias current, is formed over the substrate 10 by using an electron-beam evaporation process.

Thereafter, the photoresist layer, which is not shown in the drawing, is removed together with the Ti/Pt/Au electrode material lying thereon, by a lift-off process using an chemical solution.

Note, in this embodiment, although the front surface electrode is formed on the contact layer 16 in the main exciting region 21 and the saturable absorbing region 22 except for the separating groove region 22a, the front surface electrode may be formed on only the main exciting region 21 if an electrical connection is established between the main exciting region 21 and the saturable absorbing region 22. Also, the front surface electrode may be formed on all the area of the substrate 10 except for the saturable absorbing region 22 (including the separating groove region 22a). Optionally, the front surface electrode may be formed on the main exciting region 21 and the separating groove region 22a. Further, the front surface electrode may be formed on all the area of the substrate 10 except for the saturable absorbing region 22 (excluding the separating groove region 22a).

On the other hand, a front surface electrode may be formed on the saturable absorbing region 22 so that a bias current can be injected into the saturable absorbing region 22. With this arrangement, when a sufficient bistable hysteresis window can be obtained, it is possible to lower an operating current at the sacrifice of the bistable hysteresis window by injecting the bias current into the saturable absorbing region 22.

Thereafter, the rear surface of the substrate 10, in which no optical waveguide is formed, is polished, and a Ti/Pt/Au layer, which is not shown in the drawing, is formed on all the rear surface of the substrate 10 as an external electrode (a rear surface electrode) for exciting the active layer by supply of a bias current, using the electron-beam evaporation process.

Then, the substrate 10, on which a plurality of bistable elements 100 are formed, is cut along the boundaries between the adjacent bistable elements 100 so that the individual bistable elements 100 are separated from each other, whereby it is possible to obtain the individual bistable elements as shown in FIG. 12(a).

Note, in the production method according to this embodiment, although the stepper is used in the photolithography process, the production method is not necessarily limited to only the use of the stepper. For example, a vector scan electron exposure system may be applied to the production method.

Also, in the production method according to this embodiment, although the thermal CVD process is used for the formation of the SiO2 film 39, for example, a plasma CVD process or a sputtering process may be applied to the production method.

Also, in the production method according to this embodiment, although the MOVPE process is used as the epitaxial growth process in the production the high-mesa structure, the production method is not necessarily limited to only the MOVPE process. For example, an MBE (molecular beam epitaxy) process may be applied to the production method.

Further, in the production method according to this embodiment, although the RIE process is used as the etching process, the production method is not necessarily limited to only the RIE process. For example, an ICP process or the wet etching process may be applied to the production method.

Also, in the production method according to this embodiment, although the stepper is used in the photolithography process, the production method is not necessarily limited to only the use of the stepper. For example, a vector scan electron exposure system may be applied to the production method.

Also, in the production method according to this embodiment, although the lift-off process is used for the formation of the front surface electrode, the production method is not necessarily limited to the use of the lift-off process. For example, a method, in which a formation of an electrode pattern is carried out by using a photolithography process, and in which a disused Ti/Pt/Au electrode material is removed by using a milling process or the like, may be applied to the production method.

Note that the third embodiment is only different from the first and second embodiments in that at least one optical waveguide included in the first group and second groups 2 and/or 3 is defined as a curved optical waveguide, and thus features the same merits and advantages as in the first and second embodiments except for the below-mentioned merits or advantages obtained from such a curved optical waveguide.

In the bistable element 100, it is intended that optical fibers are connected to the other end faces (each of which is defined as the light-incidence face and/or the light-emission face at the cut side face of a substrate 10) of two adjacent optical waveguides included in the first group 2 or the second group 3, and thus a distance between the centers of the other end faces of the two adjacent optical waveguides must be set so as to be at least a diameter of the optical fiber (e.g., 62.5 μm) so that an interference can be prevented at the connections of the two adjacent optical fibers to the other end faces of the two adjacent waveguides.

On the other hand, in the bistable element as shown in FIG. 1 or FIG. 11(a), since each of the optical waveguides included in the first group 2 or the second group 3 is defined as a linear optical guide, the space between the one end faces between the two adjacent optical waveguides is substantially equal to that between the other end faces therebetween. Thus, when the bistable element 100 (the multi-mode interference optical waveguide) is miniaturized, the space between the other end faces of the two adjacent optical waveguides may be merely on the order of several microns.

For this reason, in the bistable element as shown in FIG. 1 or FIG. 11(a), the optical fibers cannot be connected to the optical waveguides in such a manner that the respective other end faces of the optical waveguides abut against the light-incidence faces (the light-emission faces) of the optical fibers. Thus, it is necessary to establish an optical connection between the optical waveguides and the optical fibers by using either a lens system which is constituted so as to be suitable for a whole of the first group of optical waveguides 2 (the second group of optical waveguide or a microlens system which is suitable for each of the optical waveguide included in the first group 2. Note, when either the lens system or the microlens system is used, not only a number of parts for constituting the bistable element is increased, but also it is necessary to carry out an adjustment of the lens system or the microlens system.

On the contrary, in the bistable element 100 according to this embodiment, at least one of the two adjacent optical waveguides is defined as the curved optical waveguide so that the space between the other end faces of the two adjacent optical waveguides can be more widened than that between the one end faces of the two adjacent optical waveguides (concretely, so that the distance between the centers of the other end faces of the two adjacent optical waveguides can be set to be at least the diameter of the optical fibers). Accordingly, the optical fibers can be connected to the optical waveguides in such a manner that the respective other end faces of the optical waveguides abut against the light-incidence faces (the light-emission faces) of the optical fibers, and thus it is possible to obtain merits or advantages that a connection structure between the bistable element 100 and the optical fibers can be simplified.

Note, when the bistable element 100 featuring the ridge structure is manufactured, a radius of curvature of the curved region in the curved optical waveguide must be on the order of several millimeters due to a restriction on manufacturing conditions. In this case, the distance measured from the one end face 1a (the other end face 1b) of the multi-mode interference optical waveguide 1 to a corresponding cue side face of the substrate 10 must be about 0.5 mm before the distance between the centers of the other end faces of the two adjacent optical waveguides can be set to be at least the diameter of the optical fibers, so that it is impossible to establish the bistable element 100 as an integrated element.

On the other hand, when the bistable element 100 featuring the high-mesa structure is manufactured, a radius of curvature of the curved region in the curved optical waveguide can fall within a range from 2 □m to 3 □m. In this case, the distance measured from the one end face 1a (the other end face 1b) of the multi-mode interference optical waveguide 1 to a corresponding cue side face of the substrate 10 can be about 30 must be about □m, so that it is possible to establish the bistable element 100 as an integrated element.

EXPLANATION OF REFERENCES

1 Multi-Mode Interference Optical Waveguide
1a One End Face
1b Other End Face
2 First Group of Optical Waveguides
2a First Optical Waveguide
2b Second Optical Waveguide
3 Second Group of Optical Waveguides
3a Third Optical Waveguide
3b Fourth Optical Waveguide
4 Electrical Separating Groove
10 Substrate
10a Etched Surface
11 Buffer Layer
12 Light-Emitting Layer
13 First Clad Layer
14 Etching Stopper Layer
15 Second Clad Layer
16 Contact Layer
21 Main Exiting Region
22 Saturable Absorbing Region
22a Separating Groove Region
31 n-InP Film
33 First p-InP Film
34 p-GaAsP Film
35 Second p-InP Film
36 p-InGaAs Film
37 Mask
38 Mask
39 SiO2 Film
40 Mask
43 i-InP Film
45 p-InP Film
100 Bistable Element
200 Bistable Element
201 Multi-Mode Interference Optical Waveguide
201a One End Face
201 Other End Face
202a First Optical Waveguide
202b Second Optical Waveguide
203a Third Optical Waveguide
203b Fourth Optical Waveguide
211 Optical Waveguide Path
212 Optical Waveguide Path
222 Port
231 Port
300 Bistable Element
301 Multi-Mode Interference Optical Waveguide
301a One End Face
301b Other End Face
302a First Optical Waveguide
302b Second Optical Waveguide
303a Third Optical Waveguide
311 Optical Waveguide Path
312 Optical Waveguide Path
321 Port
322 Port
323 Port
331 Cross-Gain Saturation Region
332 Non-Cross-Gain Saturation Region While various embodiments of the innovation have been particularly shown and described, it will be understood by those skilled in the art that various changes in form and details may be made therein without departing from the spirit and scope of the innovation as defined by the appended claims.

What is claimed is:

1. A bistable element comprising:
a multi-mode interference optical waveguide provided on a substrate, and having a number M of ports formed in one end face thereof (M is integers more than one), and a number N of ports formed in another end face (N is integers more than zero, and less than M or equal to M);
a first group of optical waveguides provided on said substrate, and including a number M of optical waveguides, each of which has one end face connected to a corresponding port formed in the one end face of said multi-mode interference optical waveguide; and
a second group of optical waveguides provided on said substrate, and including a number N of optical waveguides, each of which has one end face connected to a corresponding port formed in the other end face of said multi-mode interference optical waveguide,
characterized by the fact that said multi-mode interference optical waveguide includes a saturable absorbing region in which saturation in an amount of absorbed light is caused by the fact that an absorbing coefficient is reduced as an intensity of incident light becomes larger.

2. The bistable element as set forth in claim 1, characterized by the fact that a part of said saturable absorbing region, which is included in said multi-mode interference optical waveguide, is defined as a region in which a zero-order mode light and a first-order mode light defined as light propagating modes are not superimposed over each other.

3. The bistable element as set forth in claim 1 or 2, characterized by the fact that the part of said saturable absorbing region, which is included in said multi-mode interference optical waveguide, is defined as a region having a region width which is equal to a waveguide width of said multi-mode interference optical waveguide, and a region length which is equal to a partial waveguide length of the multi-mode interference optical waveguide measured from the one end face of said multi-mode interference optical waveguide to a predetermined location, with the part of the saturable absorbing region being the region of said multi-mode interference optical waveguide measured from the one end face of said multi-mode interference optical waveguide to the predetermined location.

4. The bistable element as set forth in claim 1 or 2, characterized by the fact:
that the optical waveguides included in said first group of optical waveguides form another part of the saturable absorbing region; and
that each of said optical waveguides is defined as a region having a region width which is equal to an optical waveguide width of the optical waveguide concerned, and a region length which is equal to an optical waveguide length of the optical waveguide concerned.

5. The bistable element as set forth in claim 1 or 2, characterized by the fact that at least one of the optical waveguides included in said first group of optical waveguides and said second group of optical waveguides is defined as an optical waveguide in which a zero-order mode light and a first-order mode light, each of which is defined as a light propagating mode, are allowed.

6. The bistable element as set forth in claim 1, characterized by the fact:

that each of said first group of optical waveguides and the second group of optical waveguides includes two optical waveguides; and that the part of said saturable absorbing region, which is included in said multi-mode interference optical waveguide, is defined as a region having a region width which is equal to a waveguide width of said multi-mode interference optical waveguide, and a region length which is equal to a partial waveguide length of the multi-mode interference optical waveguide measured from another end face of said multi-mode interference optical waveguide to a predetermined location, with the part of the saturable absorbing region being the region of said multi-mode interference optical waveguide measured from the other end face of said multi-mode interference optical waveguide to the predetermined location.

7. The bistable element as set forth in claim 6, characterized by the fact:

that the optical waveguides included in said second group of optical waveguides form another part of the saturable absorbing region; and that each of said optical waveguides is defined as a region having a region width which is equal to an optical waveguide width of the optical waveguide concerned, and a region length which is equal to an optical waveguide length of the optical waveguide concerned.

8. The bistable element as set forth in any one of claim 1, 2, 6 or 7, characterized by the fact:

that, in said first group of optical waveguides, comparing with a space between respective end faces of the two adjacent optical waveguides, a space between respective other end faces of the two adjacent optical waveguides is wider, the other end faces of the two adjacent optical waveguides being substantially parallel to a corresponding cut side face of said substrate; and that at least one the two adjacent optical waveguides is defined as a curved waveguide including a curved region.

* * * * *